(12) United States Patent
Jang et al.

(10) Patent No.: US 7,479,673 B2
(45) Date of Patent: Jan. 20, 2009

(54) SEMICONDUCTOR INTEGRATED CIRCUITS WITH STACKED NODE CONTACT STRUCTURES

(75) Inventors: Jae-Hoon Jang, Gyeonggi-do (KR); Soon-Moon Jung, Gyeonggi-do (KR); Kun-Ho Kwak, Gyeonggi-do (KR); Byung-Jun Hwang, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 390 days.

(21) Appl. No.: 11/033,432

(22) Filed: Jan. 11, 2005

(65) Prior Publication Data

US 2005/0179061 A1  Aug. 18, 2005

(30) Foreign Application Priority Data

Jan. 12, 2004 (KR) .................. 10-2004-0002088

(51) Int. Cl.
*H01L 27/02* (2006.01)
(52) U.S. Cl. .............................. 257/278; 257/E27.026; 438/153
(58) Field of Classification Search .................. 257/74, 257/278, E27.026, E21.614; 438/FOR. 426, 438/152, 53
See application file for complete search history.

(56) References Cited

U.S. PATENT DOCUMENTS

| | | | | |
|---|---|---|---|---|
| 5,278,459 | A * | 1/1994 | Matsui et al. | 327/215 |
| 5,308,782 | A | 5/1994 | Mazure et al. | 438/154 |
| 5,554,870 | A | 9/1996 | Fitch et al. | 257/334 |
| 5,675,185 | A * | 10/1997 | Chen et al. | 257/774 |
| 6,022,766 | A | 2/2000 | Chen et al. | 438/152 |
| 6,172,381 | B1 * | 1/2001 | Gardner et al. | 257/67 |
| 6,429,484 | B1 * | 8/2002 | Yu | 257/347 |
| 6,888,198 | B1 * | 5/2005 | Krivokapic | 257/347 |
| 7,109,071 | B2 * | 9/2006 | Ishikawa | 438/149 |
| 7,157,305 | B2 * | 1/2007 | Prall | 438/95 |

(Continued)

FOREIGN PATENT DOCUMENTS

KR   2003-0002328   7/2002

(Continued)

OTHER PUBLICATIONS

Korean Office Action for corresponding Korean Patent Application No. 10-2004-0002088 mailed Mar. 24, 2006.

(Continued)

*Primary Examiner*—Lex Malsawma
*Assistant Examiner*—William F Kraig
(74) *Attorney, Agent, or Firm*—Myers Bigel Sibley & Sajovec

(57) ABSTRACT

Semiconductor integrated circuits that include thin film transistors (TFTs) and methods of fabricating such semiconductor integrated circuits are provided. The semiconductor integrated circuits may include a bulk transistor formed at a semiconductor substrate and a first interlayer insulating layer on the bulk transistor. A lower TFT may be on the first interlayer insulating layer, and a second interlayer insulating layer may be on the lower TFT. An upper TFT may be on the second interlayer insulating layer, and a third interlayer insulating layer may be on the upper TFT. A first impurity region of the bulk transistor, a first impurity region of the lower TFT, and a first impurity region of the upper TFT may be electrically connected to one another through a node plug that penetrates the first, second and third interlayer insulating layers.

37 Claims, 23 Drawing Sheets

U.S. PATENT DOCUMENTS

| | | | |
|---|---|---|---|
| 7,276,421 | B2 * | 10/2007 | Kim et al. .................... 438/373 |
| 2006/0197117 | A1 * | 9/2006 | Kim et al. .................... 257/250 |
| 2006/0234487 | A1 * | 10/2006 | Kim et al. .................... 438/597 |
| 2006/0237725 | A1 * | 10/2006 | Jeong et al. .................... 257/66 |

FOREIGN PATENT DOCUMENTS

| | | |
|---|---|---|
| KR | 2003-0060142 | 1/2003 |
| KR | 2002-0058644 | 7/2003 |
| KR | 2003-0063076 | 7/2003 |

OTHER PUBLICATIONS

Korean Office Action for corresponding Korean Patent Application No. 10-2004-0002088 mailed Dec. 22, 2006.

Translation of German Office Action, Oct. 11, 2006, Application No. 10 2005 000 997.2-33.

English translation of Korean Office Action for corresponding Korean Patent Application No. 10-2004-0002088 mailed Mar. 24, 2006.

English translation of Korean Office Action for corresponding Korean Patent Application No. 10-2004-0002088 mailed Dec. 22, 2006.

* cited by examiner

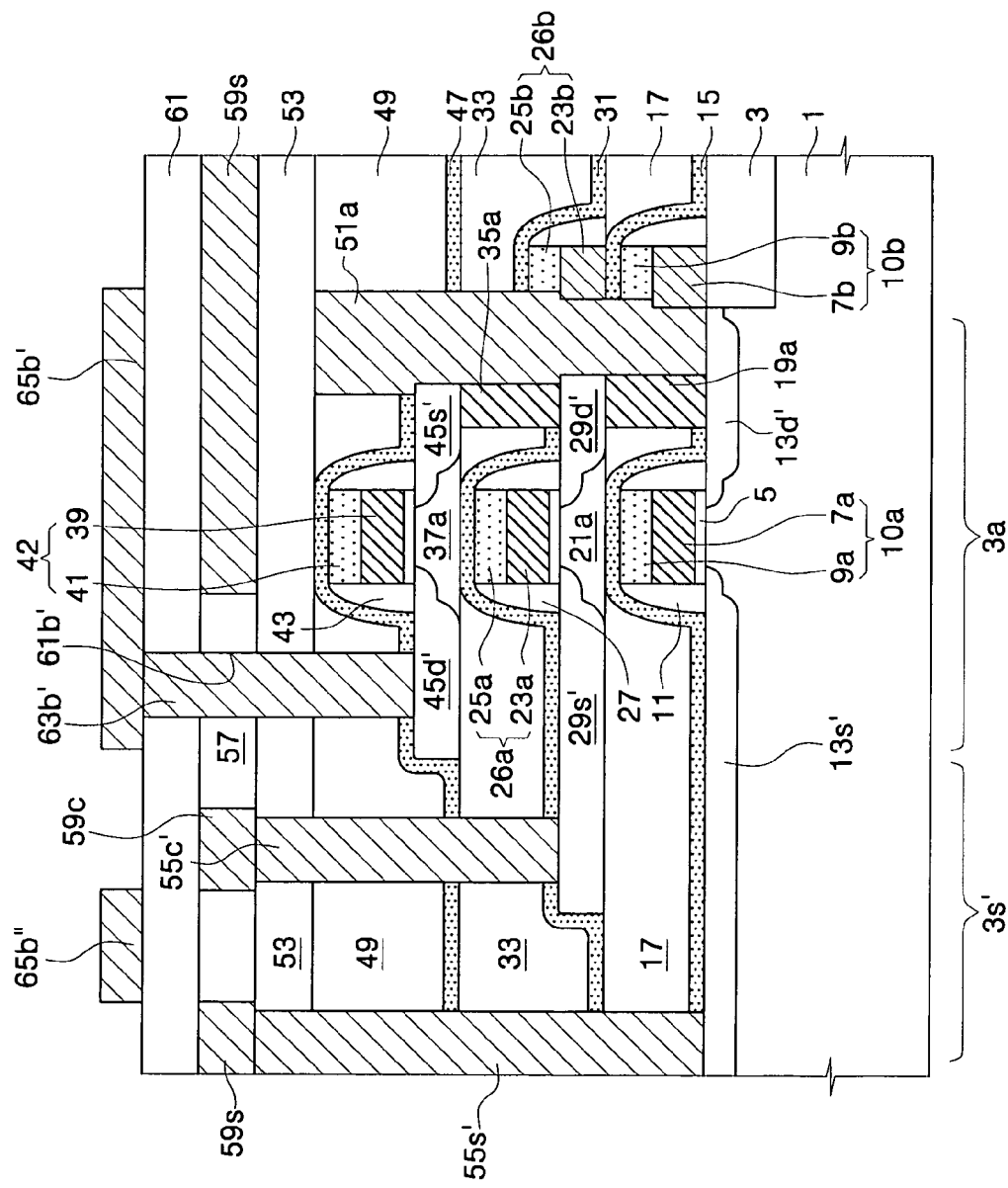

SEMICONDUCTOR INTEGRATED CIRCUITS WITH STACKED NODE CONTACT STRUCTURES

CROSS-REFERENCE TO RELATED APPLICATION

This application claims priority under 35 U.S.C. § 119 from Korean Patent Application No. 2004-0002088, filed on Jan. 12, 2004, the disclosure of which is incorporated herein by reference as if set forth in its entirety.

FIELD OF THE INVENTION

The present invention relates to semiconductor integrated circuits and, more particularly, to contact structures for semiconductor integrated circuits.

BACKGROUND OF THE INVENTION

As is known by those of skill in the art, static random access memory (SRAM) integrated circuits may exhibit relatively low power consumption and high operating speeds as compared to dynamic random access memory (DRAM) integrated circuits. As a result, SRAM circuits are widely used to implement cache memories in computers and portable consumer electronic devices.

The unit cells of an SRAM integrated circuit can be implemented, for example, as either a high load resistor SRAM cell or as a complementary metal oxide semiconductor (CMOS) SRAM cell. Typically, the high load resistor SRAM cells use a high resistance resistor as the load device, and the CMOS SRAM cells use a p-channel or "p-type" metal oxide semiconductor (PMOS) transistor as the load device.

At least two types of CMOS SRAM unit cells are known in the art. The first type is a thin film transistor (TFT) SRAM cell in which thin film transistors are stacked on a semiconductor substrate as the load device. The second type of CMOS SRAM unit cell is a bulk CMOS SRAM cell that uses bulk transistors that are formed at a semiconductor substrate as the load device.

The bulk CMOS SRAM cells may exhibit high cell stability (i.e., good low voltage characteristics and low stand-by current) as compared to TFT SRAM cells and high-load resistor SRAM cells. This high degree of cell stability may be achieved because the bulk transistors in the bulk CMOS SRAM cell are formed at a single crystalline silicon substrate, whereas the thin film transistors of the TFT SRAM cells are typically formed using polysilicon layers. However, bulk CMOS SRAM cells may exhibit low integration density and/ or weak latch-up immunity as compared to TFT SRAM cells.

Typically, each SRAM unit cell includes a pair of node contact structures. In the TFT SRAM cells, each of the node contact structures electrically connects a P-type drain region of the load transistor to an N-type drain region of a driver transistor. Typically, an ohmic contact is provided between the P-type drain region of the load transistor and the N-type drain region of the driver transistor.

Semiconductor devices that include TFTs stacked over a semiconductor substrate are disclosed in U.S. Pat. No. 6,022, 766 to Chen et al., entitled "Semiconductor Structure Incorporating Thin Film Transistors and Methods for Its Manufacture." In particular, Chen et al. discloses a semiconductor device in which a conventional bulk transistor is formed at a single crystalline silicon substrate, and a thin film transistor is then stacked over the bulk transistor. In Chen et al., the body layer of the TFT is formed by depositing an amorphous silicon layer on the semiconductor substrate and a metal plug. This amorphous silicon layer is then crystallized via a thermal treatment process. This thermal treatment process converts the amorphous silicon layer into a polycrystalline or "polysilicon" layer having large grains. The electrical characteristics of these TFTs that are formed with a polysilicon body layer may not be as good as the electrical characteristics of bulk transistors formed at a single crystalline silicon substrate.

SUMMARY OF THE INVENTION

Pursuant to embodiments of the present invention, integrated circuits are provided which include a first transistor having first and second impurity regions that is formed at a semiconductor substrate. A first interlayer insulating layer is on the first transistor, and a second transistor having first and second impurity regions is on the first interlayer insulating layer opposite the first transistor. A second interlayer insulating layer is on the second transistor opposite the first interlayer insulating layer, and a third transistor having first and second impurity regions is on the second interlayer insulating layer opposite the second transistor. Finally, a third interlayer insulating layer on the third transistor opposite the second interlayer insulating layer. The integrated circuit further includes a node plug that penetrates the first, second and third interlayer insulating layers to electrically connect the first impurity region of the first transistor, the first impurity region of the second transistor and the first impurity region of third transistor to one another.

In certain embodiments of the present invention, the second transistor may overlap the first transistor, and the third transistor may overlap the second transistor. The first transistor may be a bulk transistor whereas the second and third transistors are thin film transistors. The second and third transistors may be single crystalline thin film transistors. In specific embodiments, the integrated circuit may further include a lower node semiconductor plug that is between the first impurity region of the second transistor and the first impurity region of the first transistor and an upper node semiconductor plug that is between the first impurity region of the third transistor and the first impurity region of the second transistor. In these embodiments, the node plug may also be electrically connected to the lower and upper node semiconductor plugs. The lower and upper node semiconductor plugs may be single crystalline semiconductor plugs. The node plug may be a metal plug such as, for example, a tungsten plug or a tungsten plug with a surrounding metal barrier layer. Corresponding methods of fabricating such devices are also provided.

Pursuant to further embodiments of the present invention, static random access memory (SRAM) cells are provided which include first and second bulk transistors which are formed at least partially in a semiconductor substrate. A first interlayer insulating layer is provided on the first and second bulk transistors, and first and second lower thin film transistors are provided on the first interlayer insulating layer. A second interlayer insulating layer is provided on the first and second lower thin film transistors, and a first and second upper thin film transistors are provided on the second interlayer insulating layer. A third interlayer insulating layer is provided on the first and second upper thin film transistors. A first node plug is provided that penetrates the first, second and third interlayer insulating layers to electrically connect a first impurity region of the first bulk transistor, a first impurity region of the first lower thin film transistor and a first impurity region of the first upper thin film transistor to one another.

Finally, a second node plug is provided that penetrates the first, second and third interlayer insulating layers to electrically connect a first impurity region of the second bulk transistor, a first impurity region of the second lower thin film transistor and a first impurity region of the second upper thin film transistor to one another.

In certain embodiments of the present invention, the first lower thin film transistor may overlap the first bulk transistor and the second lower thin film transistor may overlap the second bulk transistor. Likewise, the first upper thin film transistor may overlap the first lower thin film transistor and the second upper thin film transistor may overlap the second lower thin film transistor. The first and second lower thin film transistors and the first and second upper thin film transistors may each be single crystalline thin film transistors.

In embodiments of the present invention, the SRAM cell may also include a first lower node semiconductor plug that is between the first impurity region of the first lower thin film transistor and the first impurity region of the first bulk transistor and a first upper node semiconductor plug that is between the first impurity region of the first upper thin film transistor and the first impurity region of the first lower thin film transistor. The SRAM cell may further include a second lower node semiconductor plug that is between the first impurity region of the second lower thin film transistor and the first impurity region of the second bulk transistor and a second upper node semiconductor plug that is between the first impurity region of the second upper thin film transistor and the first impurity region of the second lower thin film transistor. In these embodiments, the first node plug may be electrically connected to the first lower node semiconductor plug and the first upper node semiconductor plug, and the second node plug may be electrically connected to the second lower node semiconductor plug and the second upper node semiconductor plug. The first and second upper node semiconductor plugs and the first and second lower node semiconductor plugs may each be single crystalline semiconductor plugs. The first and second node plugs may be metal plugs such as, for example, tungsten plugs or tungsten plugs with a surrounding barrier metal layer.

The first lower node semiconductor plug may have the same conductivity type as the first impurity region of the first bulk transistor and the second lower node semiconductor plug may have the same conductivity type as the first impurity region of the second bulk transistor. In other embodiments, the first lower node semiconductor plug may have a different conductivity type than does the first impurity region of the first bulk transistor, and the second lower node semiconductor plug may have a different conductivity type than does the first impurity region of the second bulk transistor. In these embodiments, the first node plug may be in direct contact with the first impurity region of the first bulk transistor and the second node plug may be in direct contact with the first impurity region of the second bulk transistor.

In certain embodiments of the SRAM cell, the first and second bulk transistors may be first and second N-channel driver transistors, respectively, where the first impurity region of the first and second bulk transistors are each drain regions. The gate electrode of the first N-channel driver may be electrically connected to the second node plug, and the gate electrode of the second N-channel driver may be electrically connected to the first node plug. The first and second lower thin film transistors may be first and second P-channel load transistors, respectively, and the first and second upper thin film transistors may be first and second N-channel transfer transistors, respectively. The first impurity region of the first and second lower thin film transistor may each be drain regions, and the first impurity region of the first and second upper thin film transistors may each be source regions. The gate electrode of the first P-channel load transistor may be electrically connected to the second node plug and the gate electrode of the second P-channel load transistor may be electrically connected to the first node plug. The gate electrodes of the first and second N-channel transfer transistors may be electrically connected to each other to act as a word line.

In the above-mentioned embodiments, the SRAM cell may also include a ground line that is electrically connected to the source regions of the first and second N-channel driver transistors and a power line that is electrically connected to the source regions of the first and second P-channel load transistors. The SRAM cell may further include a first bit line that is electrically connected to the drain region of the first N-channel transfer transistor and a second bit line that is electrically connected to the drain region of the second N-channel transfer transistor. The first bit line may be substantially perpendicular to a gate electrode of the first N-channel driver transistor, a gate electrode of the first P-channel load transistor and a gate electrode of the first N-channel transfer transistor when viewed from an axis that is perpendicular to the primary plane of the semiconductor substrate, and the second bit line may be substantially perpendicular to a gate electrode of the second N-channel driver transistor, a gate electrode of the second P-channel load transistor and a gate electrode of the second N-channel transfer transistor when viewed from an axis that is perpendicular to the primary plane of the semiconductor substrate.

In other embodiments of the present invention, the first and second lower thin film transistors may be first and second N-channel transfer transistors, respectively, and the first and second upper thin film transistors may be first and second P-channel load transistors, respectively.

In still further embodiments of the present invention, static random access memory (SRAM) cells are provided that include an isolation layer in a semiconductor substrate that defines first and second active regions. First and second bulk transistors are provided at least partially in the first and second active regions, respectively. A first interlayer insulating layer is provided on the first and second bulk transistors, and first and second single crystalline lower body patterns are provided on the first interlayer insulating layer. First and second lower thin film transistors are provided at the first and second lower body patterns, respectively, and a second interlayer insulating layer is provided on the first and second lower thin film transistors. First and second single crystalline upper body patterns are provided on the second interlayer insulating layer, and first and second upper thin film transistors are provided at the first and second upper body patterns, respectively. A third interlayer insulating layer is provided on the first and second upper thin film transistors. A first node plug is provided that penetrates the first, second and third interlayer insulating layers to electrically connect a first impurity region of the first bulk transistor, a first impurity region of the first lower thin film transistor and a first impurity region of the first upper thin film transistor to one another, and a second node plug is provided that penetrates the first, second and third interlayer insulating layers to electrically connect a first impurity region of the second bulk transistor, a first impurity region of the second lower thin film transistor and a first impurity region of the second upper thin film transistor to one another.

In certain embodiments of these SRAM cells, the first and second bulk transistors may be respective first and second N-channel driver transistors. The first impurity region of each of the first and second bulk transistors may be a drain region. The gate electrode of the first N-channel driver transistor may be electrically connected to the second node plug, and the gate electrode of the second N-channel driver transistor may be electrically connected to the first node plug. The first and second lower thin film transistors may be respective first and second P-channel load transistors, and the first and second upper thin film transistors may be respective first and second N-channel transfer transistors. The first impurity region of the first and second lower thin film transistors may be drain regions and the first impurity region of the first and second upper thin film transistors may be source regions.

The SRAM cell may also include a first ground active region that extends from a first end of the first active region in a direction perpendicular to the first active region and a second ground active region that extends from a first end of the second active region in a direction perpendicular to the second active region.

The gate electrode of the first load transistor may overlap a gate electrode of the first driver transistor, and a gate electrode of the second load transistor may overlap the gate electrode of the second driver transistor. The gate electrode of the first load transistor may be electrically connected to the second node plug, and the gate electrode of the second load transistor may be electrically connected to the first node plug. The first lower body pattern may include an extension that overlaps a portion of the first ground active region, and the second lower body pattern may include an extension that overlaps a portion of the second ground active region.

Pursuant to still further embodiments of the present invention, methods of fabricating a static random access memory (SRAM) cell are provided. In these methods, first and second bulk transistors may be formed at a semiconductor substrate. Each of the bulk transistors may include spaced apart first and second impurity regions and a gate electrode that is on a channel region that is between the first and second impurity regions. A first interlayer insulating layer may then be formed on the semiconductor substrate having the first and second bulk transistors, and first and second lower node semiconductor plugs may be formed that penetrate the first interlayer insulating layer to be in electrical contact with the first impurity region of the first bulk transistor and the first impurity region of the second bulk transistor, respectively. First and second lower thin film transistors may then be formed on the first interlayer insulating layer. Each of these transistors may include spaced apart first and second impurity regions and a gate electrode that is on a channel region that is between the first and second impurity regions. The first impurity region of the first lower thin film transistor may be in electrical contact with the first lower node semiconductor plug and the first impurity region of the second lower thin film transistor may be in electrical contact with the second lower node semiconductor plug. The first lower thin film transistor may be formed to overlap the first bulk transistor, and the second lower thin film transistor may be formed to overlap the second bulk transistor.

Next, a second interlayer insulating layer may be formed on the semiconductor substrate having the first and second lower thin film transistors, and first and second upper node semiconductor plugs may be formed to penetrate the second interlayer insulating layer to be in electrical contact with the first impurity region of the first lower thin film transistor and the first impurity region of the second lower thin film transistor, respectively. Then first and second upper thin film transistors may be formed on the second interlayer insulating layer. Each of these transistors may include spaced apart first and second impurity regions and a gate electrode that is on a channel region that is between the first and second impurity regions. The first impurity region of the first upper thin film transistor may be in electrical contact with the first upper node semiconductor plug and the second upper thin film transistor may be in electrical contact with the second upper node semiconductor plug. The first upper thin film transistor may overlap the first lower thin film transistor and the second upper thin film transistor may overlap the second lower thin film transistor.

A third interlayer insulating layer may then be formed on the semiconductor substrate having the first and second upper thin film transistors and first and second node plugs may be formed that penetrate at least the first, second and third interlayer insulating layers. The first node plug may electrically connect the first impurity region of the first bulk transistor, the first impurity region of the first lower thin film transistor and the first impurity region of the first upper thin film transistor to one another, and the second node plug may electrically connect the first impurity region of the second bulk transistor, the first impurity region of the second lower thin film transistor and the first impurity region of the second upper thin film transistor to one another.

In specific embodiments of these method the first and second lower node semiconductor plugs may be formed by patterning the first interlayer insulating layer to form first and second lower node contact holes that respectively expose the first impurity region of the first bulk transistor and the first impurity region of the second bulk transistor. Selective epitaxial growth techniques may then be used to form first and second lower single crystalline semiconductor plugs in the respective first and second lower node contact holes. The first and second upper node semiconductor plugs may be formed in a manner similar to the method described above to form the first and second lower node semiconductor plugs.

The first lower thin film transistor may be formed by forming a first lower body pattern on the first interlayer insulating layer and in direct contact with the first lower single crystalline plug. The first lower thin film transistor is then formed at the first lower body pattern. Likewise, the second lower thin film transistor may be formed by forming a second lower body pattern on the first interlayer insulating layer and in direct contact with the second lower single crystalline plug. The second lower thin film transistor may then be formed at the second lower body pattern. The first and second lower body patterns may be formed using the respective first and second lower single crystalline plugs as seed patterns.

The first and second lower body patterns may be either amorphous and/or polycrystalline layers as formed, which may then be crystallized using solid phase epitaxial techniques. The first and second upper thin film transistors may be formed using similar techniques.

Additional methods of forming integrated circuits and SRAM cells that correspond to the specific embodiments of the present invention described above are also provided.

BRIEF DESCRIPTION OF THE DRAWINGS

The accompanying drawings, which are included to provide a further understanding of the invention and are incorporated in and constitute a part of this application, illustrate certain embodiment(s) of the invention. In the drawings:

FIGS. 10A-17A are respectively cross-sectional views taken along the line I-I of FIGS. 2-9 to illustrate methods of fabricating CMOS SRAM cells in accordance with embodiments of the present invention.

FIGS. 10B-17B are respectively cross-sectional views taken along the line II-II of FIGS. 2-9 to illustrate methods of fabricating CMOS SRAM cells in accordance with embodiments of the present invention.

DETAILED DESCRIPTION OF THE INVENTION

Figure 1:
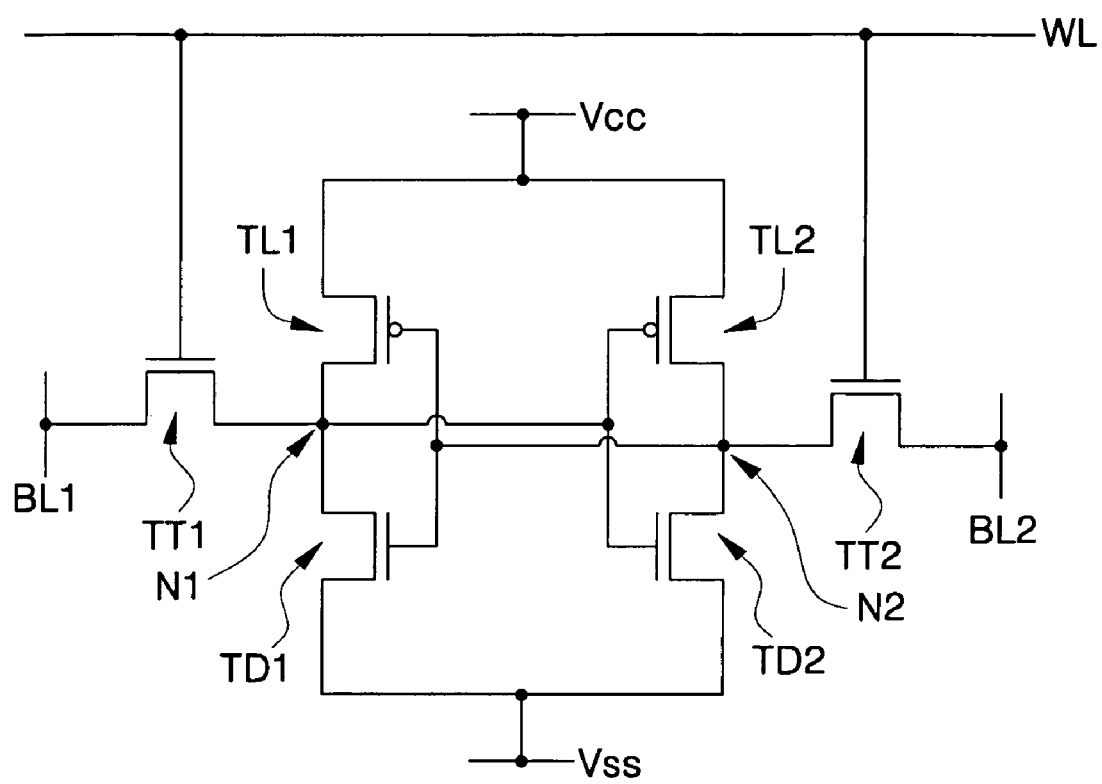
FIG. 1 is an equivalent circuit diagram of an embodiment of a CMOS SRAM cell.

Embodiments of the present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (i.e., "between" versus "directly between", "adjacent" versus "directly adjacent", etc.).

Relative terms such as "below" or "above" or "upper" or "lower" or "horizontal" or "vertical" may be used herein to describe a relationship of one element, layer or region to another element, layer or region as illustrated in the figures. It will be understood that these terms are intended to encompass different orientations of the device in addition to the orientation depicted in the figures.

It also will be understood that, as used herein, the terms "row" and "column" indicate two non-parallel directions that may be orthogonal to one another. However, the terms row and column do not indicate a particular horizontal or vertical orientation.

Embodiments of the invention are described herein with reference to cross-section illustrations that are schematic illustrations of idealized embodiments (and intermediate structures) of the invention. The thickness of layers and regions in the drawings may be exaggerated for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is an exemplary equivalent circuit diagram of a CMOS SRAM cell. As shown in FIG. 1, the CMOS SRAM cell includes a pair of driver transistors TD1 and TD2, a pair of transfer transistors TT1 and TT2, and a pair of load transistors TL1 and TL2. In FIG. 1, the driver transistors TD1 and TD2 and the transfer transistors TT1 and TT2 are NMOS transistors, whereas the load transistors TL1 and TL2 are PMOS transistors.

The first transfer transistor TT1 and the first driver transistor TD1 are connected in series. The source region of the first driver transistor TD1 is electrically connected to a ground line Vss, and the drain region of the first transfer transistor TT1 is electrically connected to a first bit line BL1. Similarly, the second driver transistor TD2 and the second transfer transistor TT2 are connected in series, and the source region of the second driver transistor TD2 is electrically connected to the ground line Vss while the drain region of the second transfer transistor TT2 is electrically connected to a second bit line BL2.

As is also shown in FIG. 1, the source region of the first load transistor TL1 is electrically connected to a power line Vcc, and the drain region of the first load transistor is electrically connected to the drain region of the first driver transistor TD1. Similarly, the source region of the second load transistor TL2 is electrically connected to the power line Vcc and the drain region of the second load transistor TL2 is electrically connected to the drain region of the second driver transistor TD2. The drain region of the first load transistor TL1, the drain region of the first driver transistor TD1, and the source region of the first transfer transistor TT1 correspond to a first node N1. The drain region of the second load transistor TL2, the drain region of the second driver transistor TD2, and the source region of the second transfer transistor TT2 correspond to a second node N2. The gate electrode of the first driver transistor TD1 and the gate electrode of the first load transistor TL1 are electrically connected to the second node N2, and the gate electrode of the second driver transistor TD2 and the gate electrode of the second load transistor TL2 are electrically connected to the first node N1. As is further shown in FIG. 1, the gate electrodes of the first and second transfer transistors TT1 and TT2 are electrically connected to a word line WL.

The above-described CMOS SRAM cell may exhibit a large noise margin and a small stand-by current as compared to a high load resistor SRAM cell. Accordingly, CMOS SRAM integrated circuits are often used in high performance SRAM applications that require a relatively low power voltage. In such applications, if the TFT SRAM cell includes high performance P-channel TFTs having enhanced electrical characteristics that correspond to P-channel bulk transistors used as load transistors of the bulk CMOS SRAM cell, the TFT SRAM cells may have advantages in terms of integration density and latch-up immunity as compared to bulk CMOS SRAM cells.

In order to improve the performance of the P-channel TFTs, the TFTs may be formed at a single crystalline semiconductor body pattern. Also, ohmic contacts may be formed at the first and second nodes N1 and N2 shown in FIG. 1.

Furthermore, when the transfer transistors TT1 and TT2 shown in FIG. 1 are stacked over the semiconductor substrate, the area of each SRAM cell may be remarkably reduced as compared to the area of conventional TFT SRAM cells.

FIGS. 2-9 are plan views illustrating structures of compact TFT SRAM cells in accordance with embodiments of the present invention. Each of FIGS. 2-9 shows 4 unit cells. In FIGS. 2-7, a pair of unit cells adjacent to each other along a y-axis are symmetrical with respect to an x-axis, and a pair of unit cells adjacent to each other along the x-axis are symmetrical with respect to the y-axis.

FIGS. 10A-17A are cross-sectional views taken along the line I-I of FIGS. 2-9, respectively, to illustrate methods of fabricating TFT SRAM cells in accordance with embodiments of the present invention. FIGS. 10B-17B are cross-sectional views taken along the line II-II of FIGS. 2-9, respectively, to further illustrate methods of fabricating TFT SRAM cells in accordance with embodiments of the present invention.

First, structures of the TFT SRAM cells in accordance with embodiments of the present invention will be described with reference to FIGS. 2-9, 17A and 17B.

Figure 2:
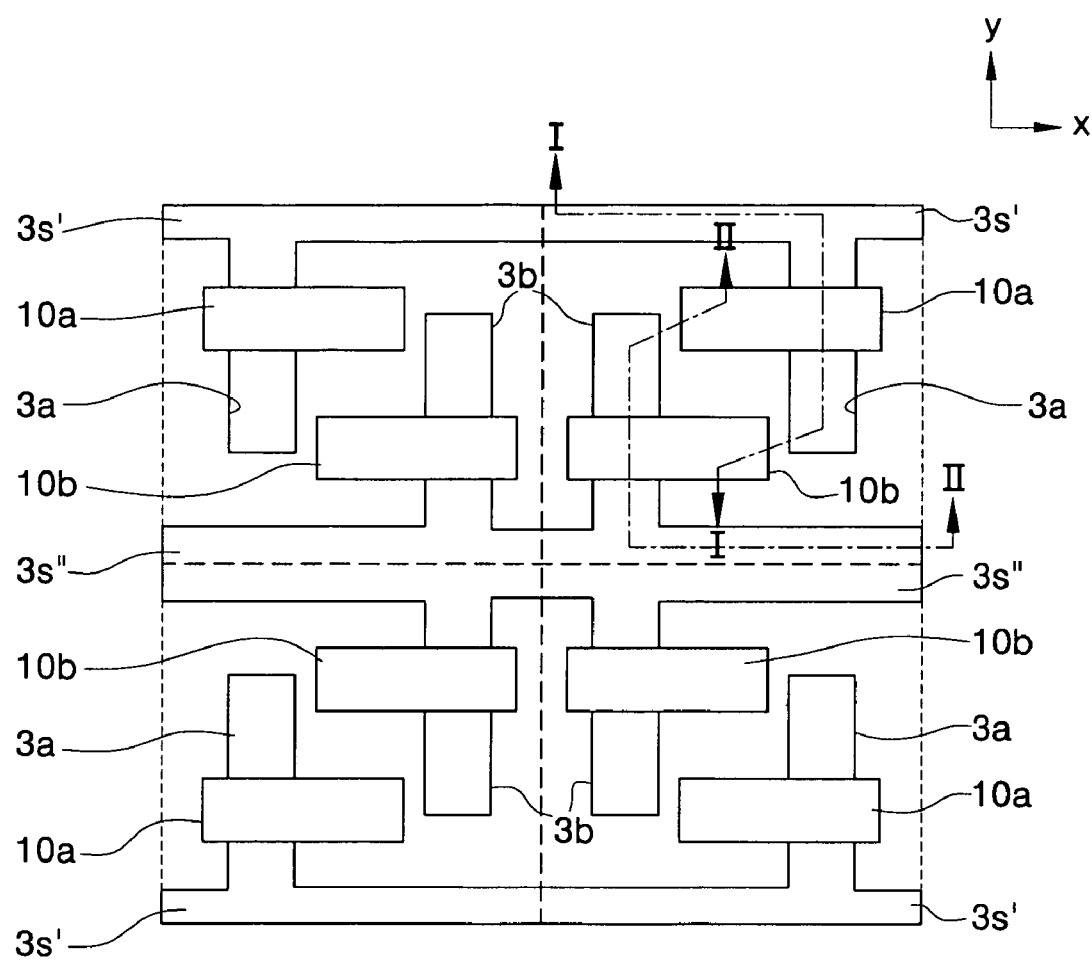
FIG. 2 is a plan view illustrating active regions and driver gate electrodes of CMOS SRAM cells in accordance with embodiments of the present invention.
Figure 17B:
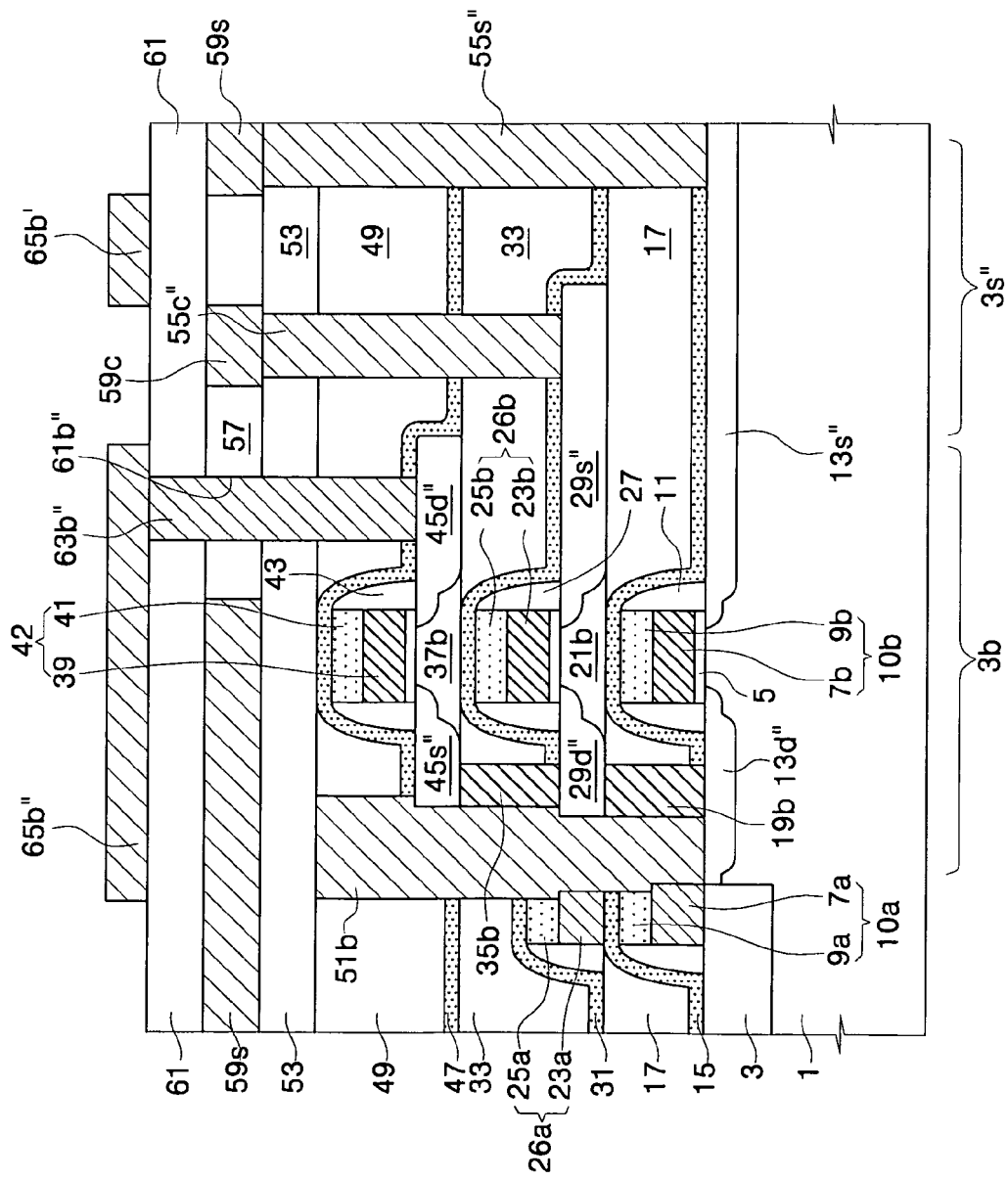

Referring to FIGS. 2, 17A and 17B, an isolation layer 3 is provided at a predetermined region of a semiconductor substrate 1 to define first and second active regions 3a and 3b in each unit cell. The semiconductor substrate 1 may be a single crystalline semiconductor substrate such as, for example, a single crystalline silicon substrate. As best seen in FIG. 2, the first and second active regions 3a and 3b may be disposed to be parallel with a y-axis. One end of the first active region 3a may also extend in parallel with an x-axis to provide a first ground active region 3s', and one end of the second active region 3b may likewise extend in parallel with the x-axis to provide a second ground active region 3s". As a result, the first and second ground active regions 3s' and 3s" may be disposed in parallel with each other.

First and second driver gate patterns 10a and 10b are provided that cross over the first and second active regions 3a and 3b, respectively. The first driver gate patterns 10a may be disposed parallel to the second driver gate patterns 10b. As shown in FIG. 17a, the first driver gate pattern 10a may include a first driver gate electrode 7a and a first capping insulating layer pattern 9a which are sequentially stacked. As shown in FIG. 17b, the second driver gate pattern 10b may include a second driver gate electrode 7b and a second capping insulating layer pattern 9b which are sequentially stacked. A gate insulating layer 5 may be interposed between the driver gate patterns 10a and 10b and the respective active regions 3a and 3b.

As shown in FIG. 17a, a first drain region 13d' is provided at a surface of the first active region 3a. The first drain region 13d' may be adjacent to the first driver gate pattern 10a and located opposite the first ground active region 3s'. A first source region 13s' may be provided at a surface of the first ground active region 3s' and at a surface of the first active region 3a. The first source region 13s' may be adjacent to the first driver gate pattern 10a and located opposite the first drain region 13d'.

Similarly, as shown in FIG. 17b, a second drain region 13d" is provided at a surface of the second active region 3b. The second drain region 13d" may be adjacent to the second driver gate pattern 10b and located opposite the second ground active region 3s". A second source region 13s" may be provided at a surface of the second ground active region 3s" and at a surface of the second active region 3b. The second source region 13s" may be adjacent to the second driver gate pattern 10b and located opposite the second drain region 13d".

The first and second source regions 13s' and 13s" and the first and second drain regions 13d' and 13d" may be lightly doped drain (LDD) type impurity regions. Additionally, driver gate spacers 11 may be provided on sidewalls of the first and second driver gate patterns 10a and 10b.

The first driver gate pattern 10a may extend to be adjacent to the second drain region 13d". Similarly, the second driver gate pattern 10b may extend to be adjacent to the first drain region 13d'.

The first driver gate pattern 10a, the first drain region 13d' and the first source region 13s' constitute a first bulk transistor such as, for example, the first driver transistor TD1 in FIG. 1. Likewise, the second driver gate pattern 10b, the second drain region 13d" and the second source region 13s" constitute a second bulk transistor such as, for example, the second driver transistor TD2 of FIG. 1. Thus, in embodiments of the present invention, the first and second driver transistors TD1 and TD2 may be N-type bulk transistors that are formed at the semiconductor substrate. As shown in FIGS. 2, 17A and 17B, the area occupied by the first and second driver transistors TD1 and TD2 may comprise a substantial percentage of the area of the SRAM cell. Accordingly, pursuant to embodiments of the present invention, SRAM cells may be provided that have a significantly reduced cell area as compared to the area occupied by a conventional SRAM cell that has four or six bulk MOS transistors.

As shown in FIGS. 17A and 17B, a first interlayer insulating layer 17 is provided on the semiconductor substrate and on the first and second driver transistors TD1 and TD2. The first interlayer insulating layer 17 may have a planarized top surface. In addition, a first etch stopper 15 may be interposed between the first interlayer insulating layer 17 and the semiconductor substrate and between the first interlayer insulating layer and the driver transistors TD1 and TD2. The first etch stopper 15 may, for example, comprise an insulating layer that has an etch selectivity with respect to the first interlayer insulating layer 17. For instance, if the first interlayer insulating layer 17 is a silicon oxide layer, the first etch stopper 15 might be a silicon nitride layer or a silicon oxynitride layer.

Figure 3:
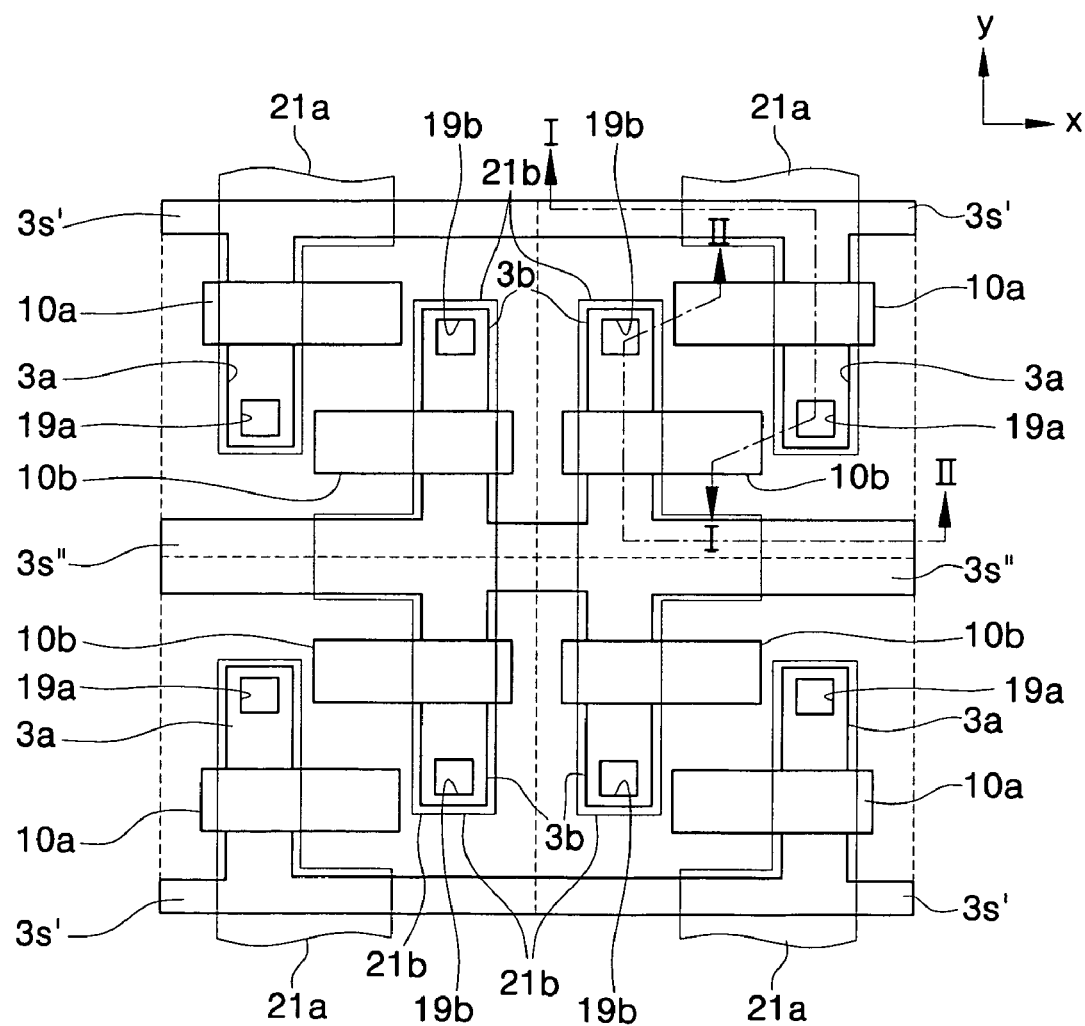
FIG. 3 is a plan view illustrating first and second lower node semiconductor plugs and first and second lower single crystalline body layers of CMOS SRAM cells in accordance with embodiments of the present invention.

As shown in FIGS. 3, 17A and 17B, the first drain region 13d' may be electrically connected to a first lower node semiconductor plug 19a. Likewise, the second drain region 13d" may be electrically connected to a second lower node semiconductor plug 19b. The first and second lower node semiconductor plugs 19a, 19b each penetrate the first interlayer insulating layer 17 and the first etch stopper 15. When the semiconductor substrate 1 is a single crystalline silicon substrate, the first and second lower node semiconductor plugs 19a and 19b may be single crystalline silicon plugs.

As is also shown in FIGS. 3, 17A and 17B, first and second lower body patterns 21a, 21b may be disposed on the first interlayer insulating layer 17. The first lower body pattern 21a may cover the first lower node semiconductor plug 19a. The first lower body pattern 21a may overlap with the first active region 3a, and may extend to also overlap a portion of the first ground active region 3s'. Similarly, the second lower body pattern 21b may cover the second lower node semiconductor plug 19b. The second lower body pattern 21b may overlap with the second active region 3b, and may extend to also overlap a portion of the second ground active region 3s". The first and second lower body patterns 21a and 21b may, for example, comprise single crystalline silicon patterns.

Figure 4:
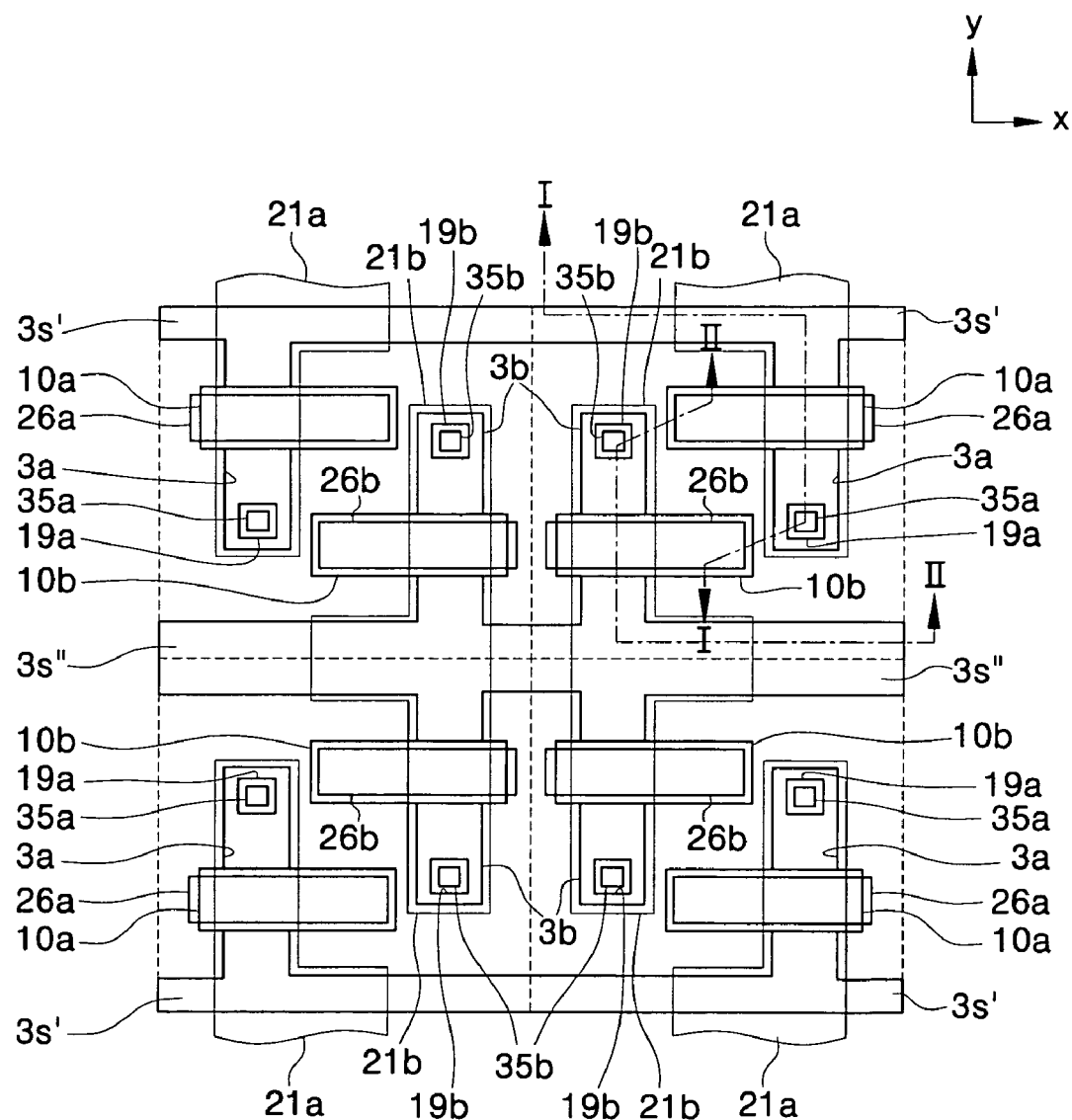
FIG. 4 is a plan view illustrating first and second load gate electrodes and first and second upper node semiconductor plugs of CMOS SRAM cells in accordance with embodiments of the present invention.

Referring to FIGS. 4, 17A and 17B, a first load gate pattern 26a may be formed on and crossing over the first lower body pattern 21a, and a second load gate pattern 26b may be formed on and crossing over the second lower body pattern 21b. The first load gate pattern 26a may include a first load gate electrode 23a and a first capping insulating layer pattern 25a which are sequentially stacked. The second load gate pattern 26b may include a second load gate electrode 23b and a second capping insulating layer pattern 25b which are sequentially stacked. The first and second load gate patterns 26a and 26b may be insulated from the lower body patterns 21a and 21b by a gate insulating layer (shown, but not numbered, in FIGS. 17A and 17B). The first load gate patterns 26a may overlap the first driver gate pattern 10a and the second load gate pattern 26b may overlap the second driver gate pattern 10b.

A first impurity region 29d' is provided in a portion of the first lower body pattern 21a that is adjacent to the first load gate pattern 26a. The portion of the first lower body pattern 21a that comprises the first impurity region 29d' may include a portion of the first lower body pattern 21a that is in contact with the first lower node semiconductor plug 19a. A second impurity region 29s' is provided in another portion of the first lower body pattern 21a that is adjacent to the first load gate pattern 26a and opposite the first impurity region 29d'. The first load gate pattern 26a and the first and second impurity regions 29d' and 29s' may together constitute a first lower TFT such as, for example, the first load transistor TL1 of FIG. 1. The first and second impurity regions 29d' and 29s' may act as drain and source regions of the first lower TFT, respectively.

Similarly, a first impurity region 29d" is provided in a portion of the second lower body pattern 21b that is adjacent to the second load gate pattern 26b. The portion of the second lower body pattern 21b that comprises the first impurity region 29d" may include a portion of the second lower body pattern 21b that is in contact with the second lower node semiconductor plug 19b. A second impurity region 29s" is provided in another portion of the second lower body pattern 21b that is adjacent to the second load gate pattern 26b and opposite the first impurity region 29d". The second load gate pattern 26b and the first and second impurity regions 29d" and 29s" may together constitute a second lower TFT such as, for example the second load transistor TL2 of FIG. 1. The first and second impurity regions 29d" and 29s" may act as drain and source regions of the second lower TFT, respectively.

The first and second load transistors TL1 and TL2 may correspond to P-type transistors. The source and drain regions 29s', 29s", 29d' and 29d" may be LDD type impurity regions. Load gate spacers 27 may be provided on sidewalls of the first and second load gate patterns 26a and 26b.

A second interlayer insulating layer 33 may be formed on the semiconductor substrate having the first and second load transistors TL1 and TL2. The second interlayer insulating layer 33 may have a planarized top surface. In addition, a second etch stopper 31 may be interposed between the second interlayer insulating layer 33 and the semiconductor substrate having the load transistors TL1 and TL2. The second etch stopper 31 may, for example, comprise an insulating layer that has an etch selectivity with respect to the second interlayer insulating layer 33. For instance, when the second interlayer insulating layer 33 is a silicon oxide layer, the second etch stopper 31 may be a silicon nitride layer or a silicon oxynitride layer.

As shown in FIG. 17A, the first drain region 29d' may be electrically connected to a first upper node semiconductor plug 35a. As shown in FIG. 17B, the second drain region 29d" may be electrically connected to a second upper node semiconductor plug 35b. The first and second upper node semiconductor plugs 35a, 35b may each penetrate the second interlayer insulating layer 33 and the second etch stopper 31. The first and second upper node semiconductor plugs 35a and 35b may be single crystalline silicon plugs.

Figure 5:
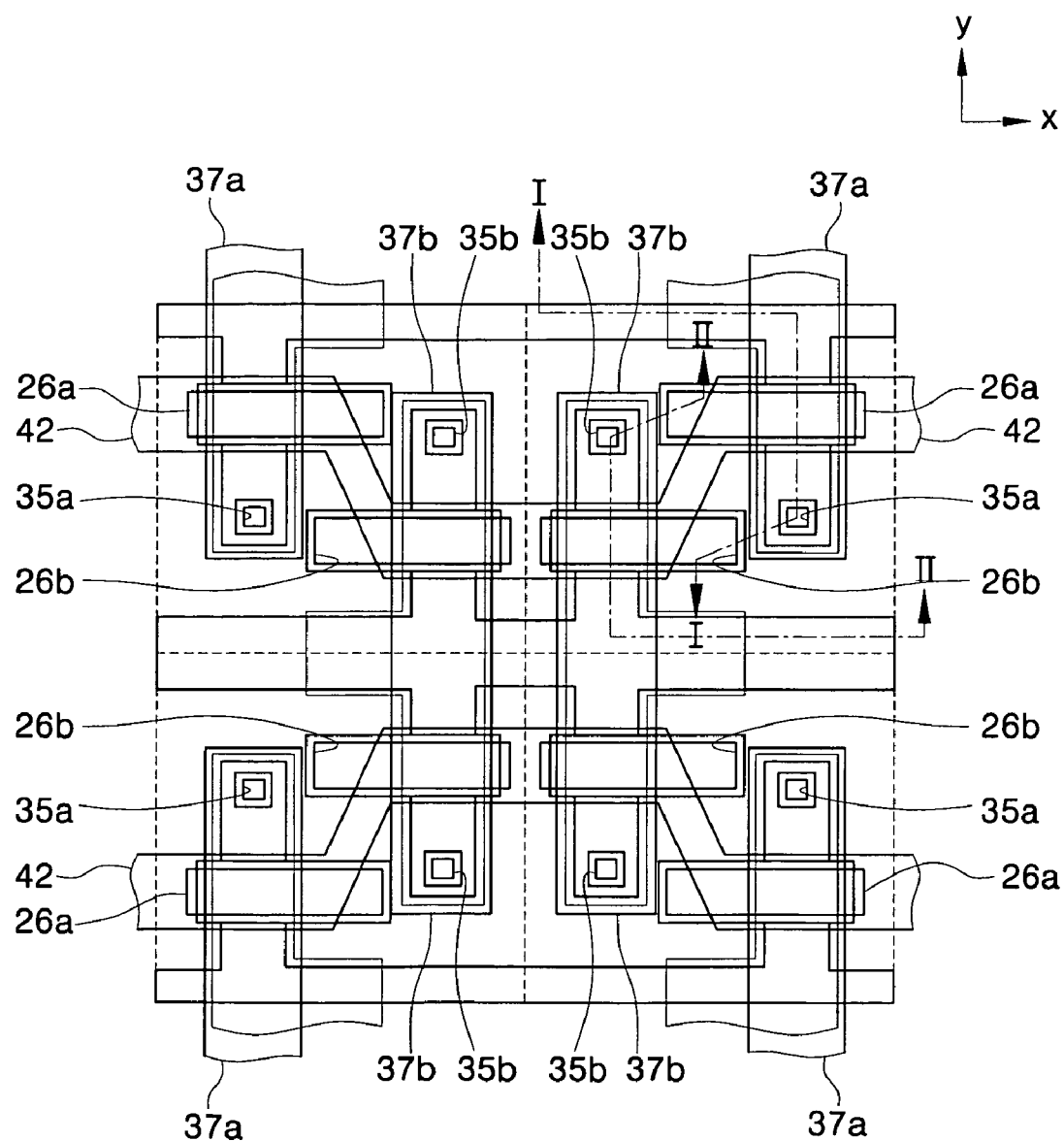
FIG. 5 is a plan view illustrating first and second upper single crystalline body layers and word lines of CMOS SRAM cells in accordance with embodiments of the present invention.

Referring to FIGS. 5, 17A and 17B, first and second upper body patterns 37a and 37b may be provided on the second interlayer insulating layer 33. The first and second upper body patterns 37a and 37b may be on the first and second upper node semiconductor plugs 35a and 35b, respectively. The first and second upper body patterns 37a and 37b may also overlap the first and second lower body patterns 21a and 21b, respectively. The first and second upper body patterns 37a and 37b may, for example, comprise single crystalline semiconductor patterns such as single crystalline silicon patterns.

A word line pattern 42 is formed to cross over the first and second upper body patterns 37a and 37b. The word line pattern 42 may overlap the first and second load gate patterns 26a and 26b. In embodiments of the present invention, the word line pattern 42 may include a word line 39 and a capping insulating layer pattern 41 which are sequentially stacked. The word line 39 may be insulated from the first and second upper body patterns 37a and 37b by a gate insulating layer (shown, but not numbered, in FIGS. 17A and 17B).

As shown in FIG. 17A, a first impurity region 45s' is provided in a portion of the first upper body pattern 37a that is adjacent to the word line pattern 42 and that contacts the first upper node semiconductor plug 35a. A second impurity region 45d' is provided in a portion of the first upper body pattern 37a that is adjacent to the word line pattern 42 and that is opposite the first impurity region 45s'. The word line pattern 42, the first impurity region 45s' and the second impurity region 45d' may together constitute a first upper TFT such as, for example, the first transfer transistor TT1 of FIG. 1. The first and second impurity regions 45s' and 45d' may act as source and drain regions of the first upper TFT, respectively.

As shown in FIG. 17B, a first impurity region 45s'' is provided in a portion of the second upper body pattern 37b that is adjacent to the word line pattern 42 and that contacts the second upper node semiconductor plug 35b. A second impurity region 45d'' is provided in a portion of the second upper body pattern 37b that is adjacent to the word line pattern 42 and that is opposite the first impurity region 45s''. The word line pattern 42, the first impurity region 45s'' and the second impurity region 45d'' may together constitute a second upper TFT such as, for example, the a second transfer transistor TT2 of FIG. 1. The first and second impurity regions 45s'' and 45d'' may act as source and drain regions of the second upper TFT, respectively.

The first and second transfer transistors TT1 and TT2 correspond to N-type transistors. The source and drain regions 45s', 45s'', 45d' and 45d'' of the first and second transfer transistors TT1 and TT2 may be LDD type impurity regions. Gate spacers 43 may be provided on sidewalls of the word line pattern 42. The word line 39 on the first upper body pattern 37a corresponds to a gate electrode of the first transfer transistor TT1, and the word line 39 on the second upper body pattern 37b corresponds to a gate electrode of the second transfer transistor TT2.

As shown in FIGS. 17A and 17B, a third interlayer insulating layer 49 is provided on the semiconductor substrate that includes the first and second transfer transistors TT1 and TT2. The third interlayer insulating layer 49 may have a planarized top surface. In addition, a third etch stopper 47 may be provided between the third interlayer insulating layer 49 and the semiconductor substrate having the transfer transistors TT1 and TT2. The third etch stopper 47 may, for example, comprise an insulating layer that has an etch selectivity with respect to the third interlayer insulating layer 49. For example, when the third interlayer insulating layer 49 is a silicon oxide layer, the third etch stopper 47 may be a silicon nitride layer or a silicon oxynitride layer.

Figure 6:
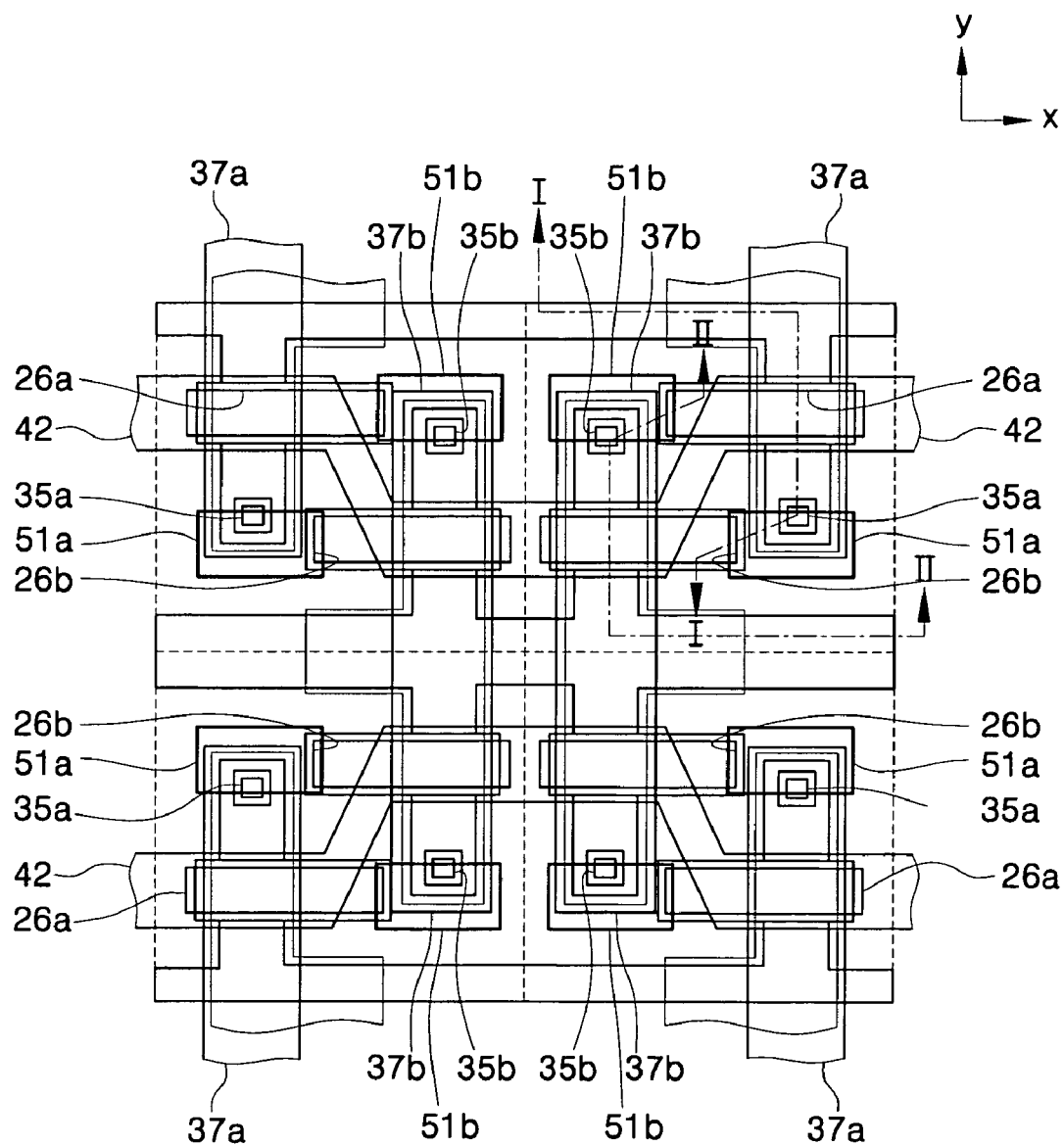
FIG. 6 is a plan view illustrating first and second node plugs of CMOS SRAM cells in accordance with embodiments of the present invention.

Referring to FIGS. 6, 17A and 17B, when the first and second lower node semiconductor plugs 19a and 19b have the same conductivity types as the first and second drain regions 13d' and 13d'' of the driver transistors TD1 and TD2, the first lower node semiconductor plug 19a, the first upper node semiconductor plug 35a, the first drain region 29d' of the first load transistor TL1, the first source region 45s' of the first transfer transistor TT1, the second driver gate electrode 7b, and the second load gate electrode 23b are electrically connected to one another through a first node plug 51a that penetrates the first to third etch stoppers 15, 31 and 47 as well as the first to third interlayer insulating layers 17, 33 and 49.

Likewise, the second lower node semiconductor plug 19b, the second upper node semiconductor plug 35b, the second drain region 29d'' of the second load transistor TL2, the second source region 45s'' of the second transfer transistor TT2, the first driver gate electrode 7a, and the first load gate electrode 23a are electrically connected to one another through a second node plug 51b that penetrates the first to third etch stoppers 15, 31 and 47 as well as the first to third interlayer insulating layers 17, 33 and 49.

The first and second node plugs 51a and 51b may be conductive layers that form an ohmic contact with respect to all of the P-type and N-type semiconductor layers. For example, each of the first and second node plugs 51a and 51b may comprise a tungsten plug. In other embodiments of the present invention, the first and second node plugs 51a and 51b may comprise a tungsten plug and a barrier metal layer that surrounds the tungsten plug.

In other embodiments of the present invention, the first and second lower node semiconductor plugs 19a and 19b may have a different conductivity type from the first and second drain regions 13d' and 13d'', or may be formed of an intrinsic semiconductor material. The first and second node plugs 51a and 51b may be extended so that the first and second node plugs 51a and 51b are electrically connected to the first and second drain regions 13d' and 13d'', respectively.

The first lower node semiconductor plug 19a, the first upper node semiconductor plug 35a, the first drain region 13d' of the first driver transistor TD1, the first drain region 29d' of the first load transistor TL1, the first source region 45s' of the first transfer transistor TT1, the second driver gate electrode 7b, the second load gate electrode 23b, and the first node plug 51a constitute a first node contact structure. Likewise, the second lower node semiconductor plug 19b, the second upper node semiconductor plug 35b, the second drain region 13d'' of the second driver transistor TD2, the second drain region 29d'' of the second load transistor TL2, the second source region 45s'' of the second transfer transistor TT2, the first driver gate electrode 7a, the first load gate electrode 23a and the second node plug 51b constitute a second node contact structure.

As shown in FIGS. 17A and 17B, a fourth interlayer insulating layer 53 may be provided on the semiconductor substrate having the first and second node plugs 51a and 51b.

Figure 7:
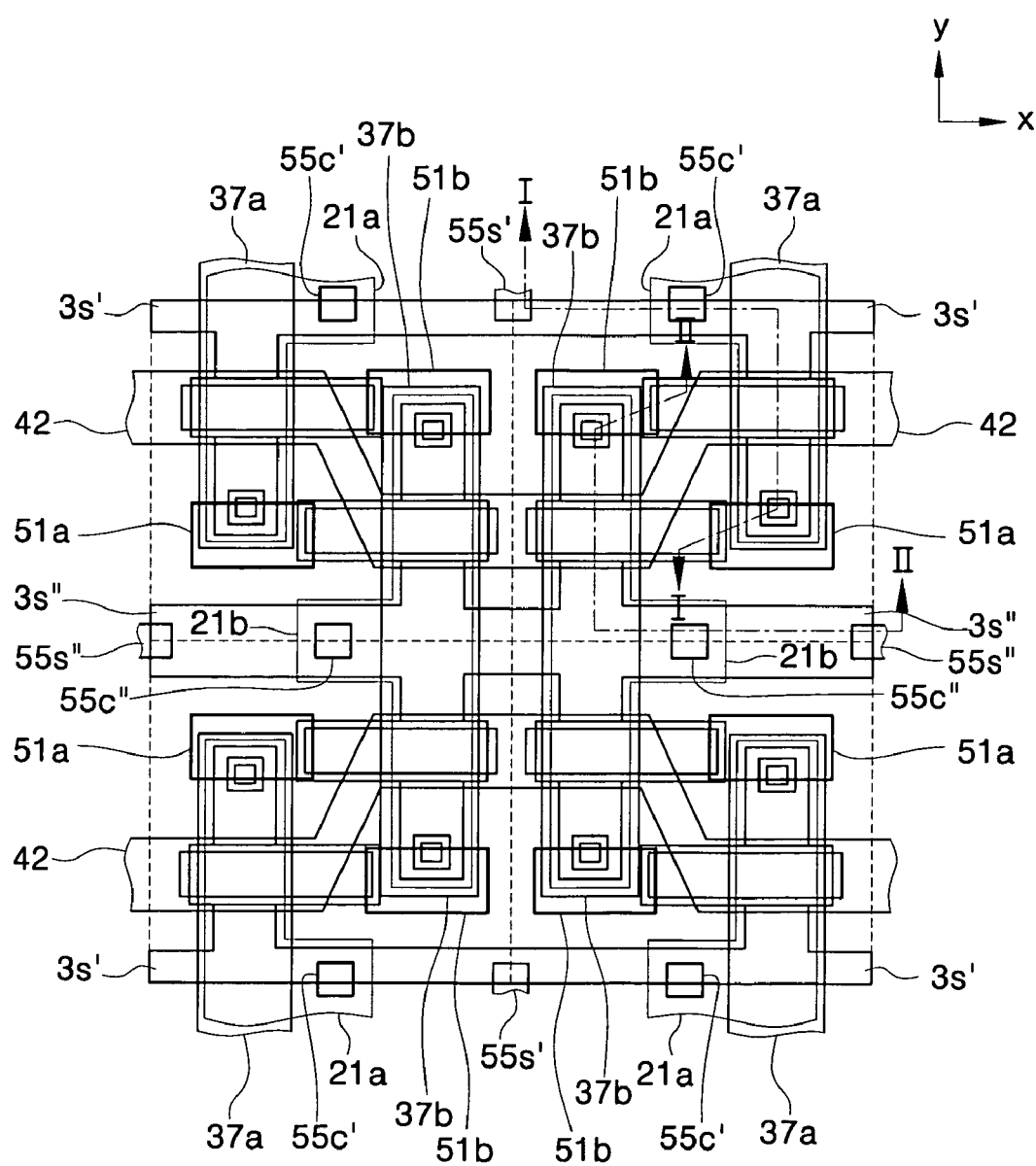
FIG. 7 is a plan view illustrating first and second power line contact plugs and first and second ground line contact plugs of CMOS SRAM cells in accordance with embodiments of the present invention.

As shown FIGS. 7, 17A and 17B, the extension of the first lower body pattern 21a (i.e., the source region 29s'' of the first load transistor TL1) is electrically connected to a first power line contact plug 55c' that penetrates the second etch stopper 31, the second interlayer insulating layer 33, the third etch stopper 47, the third interlayer insulating layer 49 and the fourth interlayer insulating layer 53. Similarly, the extension of the second lower body pattern 21b (i.e., the source region 29s''' of the second load transistor TL2) is electrically connected to a second power line contact plug 55c'' that penetrates the second etch stopper 31, the second interlayer insulating layer 33, the third etch stopper 47, the third interlayer insulating layer 49 and the fourth interlayer insulating layer 53.

In addition, the first ground active region 3s', namely, the source region 13s' of the first driver transistor TD1 is electrically connected to a first ground line contact plug 55s' that penetrates the first to fourth interlayer insulating layers 17, 3, 49 and 53 and the first to third etch stoppers 15, 31 and 47. Similarly, the second ground active region 3s'', namely, the source region 13s'' of the second driver transistor TD2 is electrically connected to a second ground line contact plug 55s'' that penetrates the first to fourth interlayer insulating layers 17, 3, 49 and 53 and the first to third etch stoppers 15, 31 and 47.

The power line contact plugs 55c' and 55c''' and the ground line contact plugs 55s' and 55s''' may, for example, be metal plugs such as tungsten plugs. Furthermore, each of the power line contact plugs 55c' and 55c''' and the ground line contact plugs 55s' and 55s''' may include a tungsten plug and a barrier metal layer surrounding the tungsten plug. A fifth interlayer insulating layer 57 is provided on the semiconductor substrate having the power line contact plugs 55c' and 55c''' and the ground line contact plugs 55s' and 55s'''.

Figure 8:
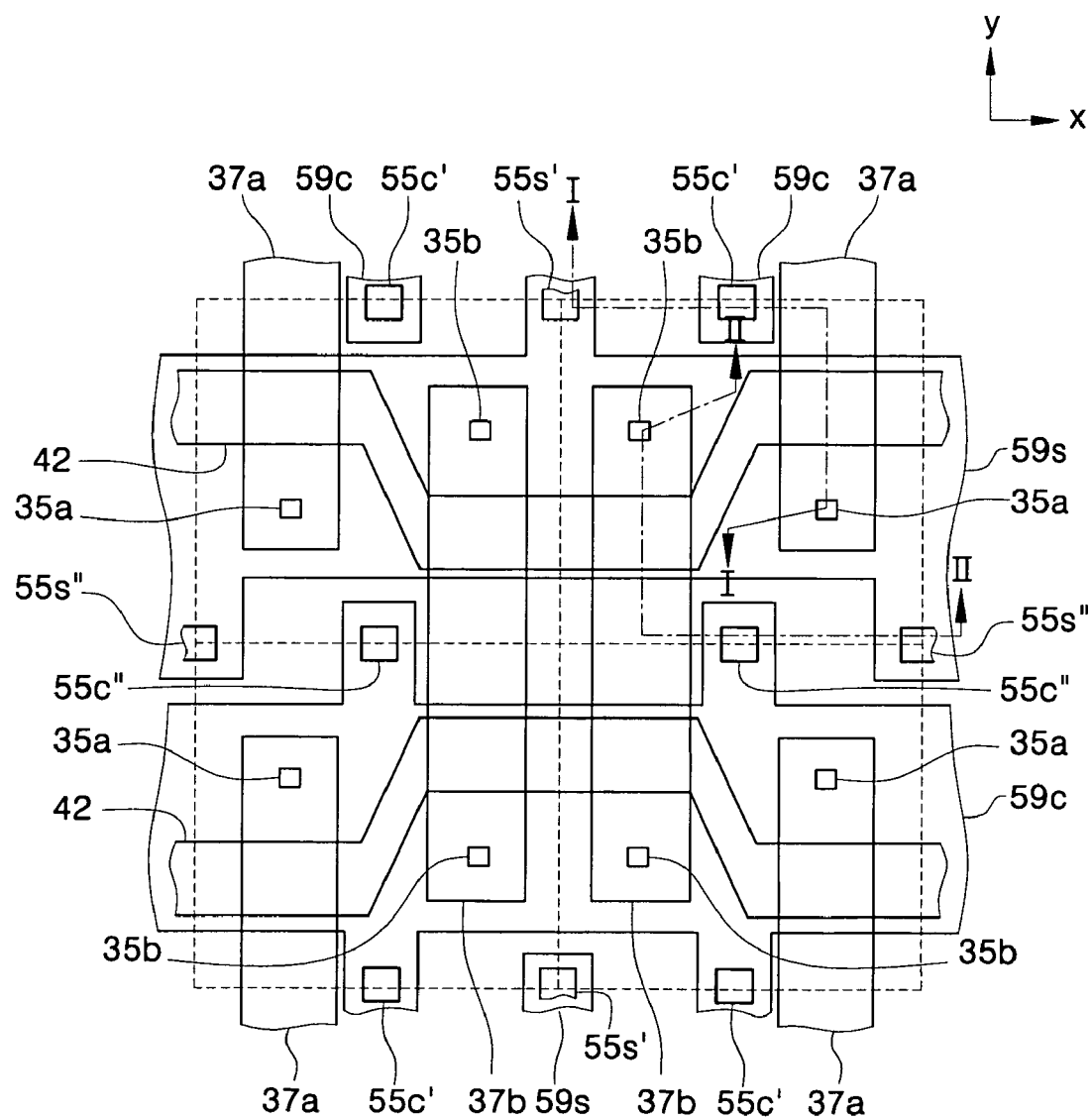
FIG. 8 is a plan view illustrating a power line and a ground line of CMOS SRAM cells in accordance with embodiments of the present invention.

FIG. 8 is a plan view illustrating power lines 59c and ground lines 59s for CMOS SRAM cells in accordance with embodiments of the present invention. In FIG. 8, the ground active regions 3s' and 3s''', the lower body patterns 21a and 21b, and the node plugs 51a and 51b that are shown in FIG. 7 are not included to reduce the complexity of the drawing.

As shown in FIGS. 8, 17A and 17B, ground lines 59s and power lines 59c are disposed in the fifth interlayer insulating layer 57. When the SRAM unit cells in accordance with embodiments of the present invention are two-dimensionally arrayed along rows and columns that are disposed in parallel with the x-axis and y-axis respectively, the ground lines 59s and the power lines 59c may be disposed in odd rows and even rows, respectively. In other words, the ground lines 59s are disposed to overlap with odd-numbered word line patterns 42, and the power lines 59c are disposed to overlap with even-numbered word line patterns 42. In other embodiments, the ground lines 59s and the power lines 59c may be disposed in even rows and odd rows, respectively. The power lines 59c are disposed to cover the power line contact plugs 55c' and 55c''', and the ground lines 59s are disposed to cover the ground line contact plugs 55s' and 55s'''. As a result, the ground lines 59s and the power lines 59c may be disposed to be substantially in parallel with the word line patterns 42. The power lines 59c, the ground lines 59s and the fifth interlayer insulating layer 57 are covered with a sixth interlayer insulating layer 61.

Figure 9:
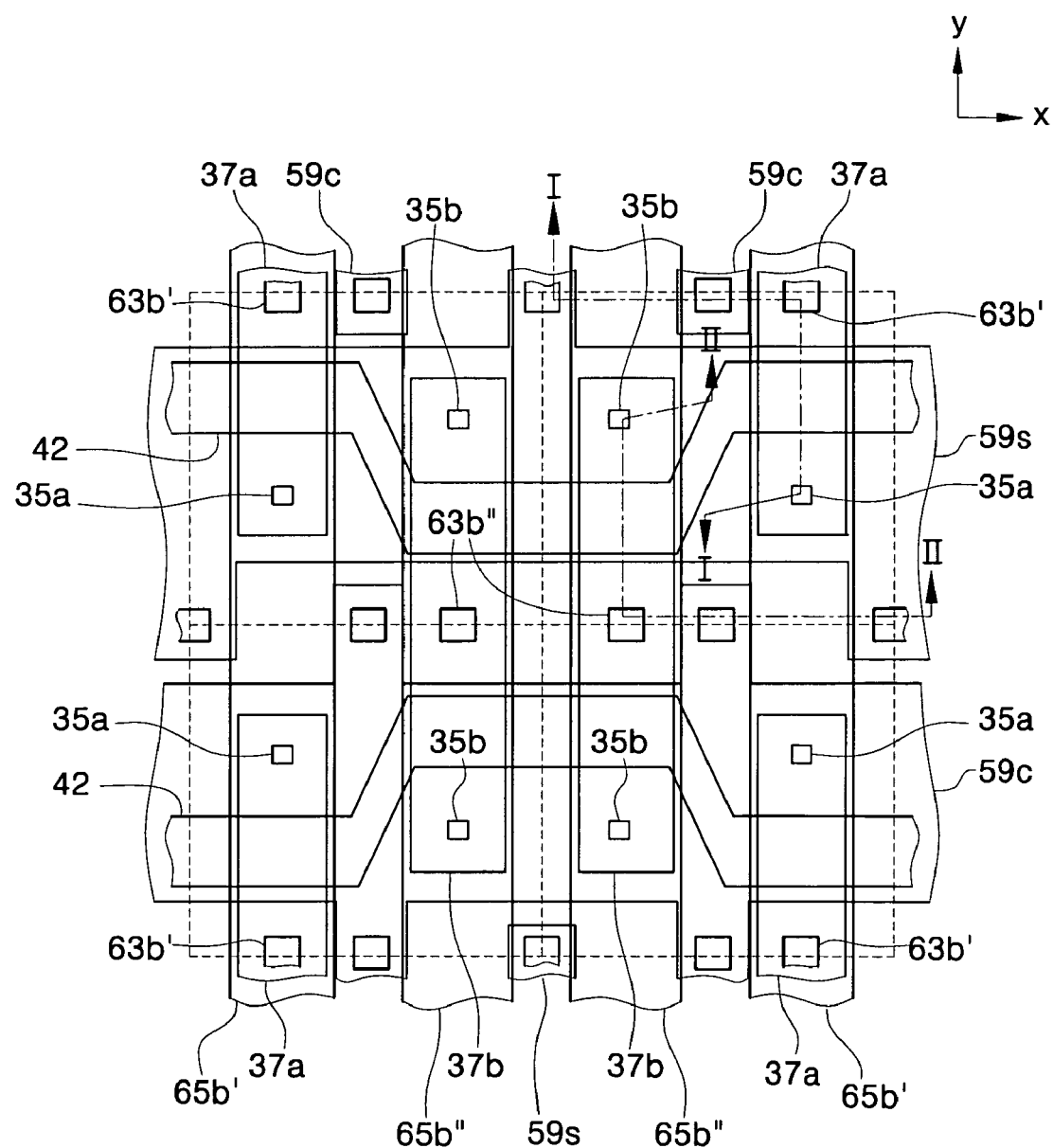
FIG. 9 is a plan view illustrating first and second bit line contact plugs as well as first and second bit lines of CMOS SRAM cells in accordance with embodiments of the present invention.

Referring to FIGS. 9, 17A and 17B, the drain region 45d' of the first transfer transistor TT1 may be electrically connected to a first bit line contact plug 63b' that penetrates the third to sixth interlayer insulating layers 49, 53, 57 and 61 and the third etch stopper 47. Similarly, the drain region 45d'' of the second transfer transistor TT2 may be electrically connected to a second bit line contact plug 63b'' that penetrates the third to sixth interlayer insulating layers 49, 53, 57 and 61 and the third etch stopper 47.

First and second parallel bit lines 65b' and 65b'' may be disposed on the sixth interlayer insulating layer 61. The first bit line 65b' is disposed to be in contact with the first bit line contact plug 63b', and the second bit line 65b'' is disposed to be in contact with the second bit line contact plug 63b''. The first and second bit lines 65b', 65'' are disposed to cross over the power line 59c and the ground line 59s.

In other embodiments of the present invention, the first and second node contact structures described with reference to FIGS. 6, 17A and 17B may be modified in many different forms. For example, FIG. 14C is a cross-sectional view illustrating a first node contact structure of CMOS SRAM cells according to further embodiments of the present invention.

Figure 14A:
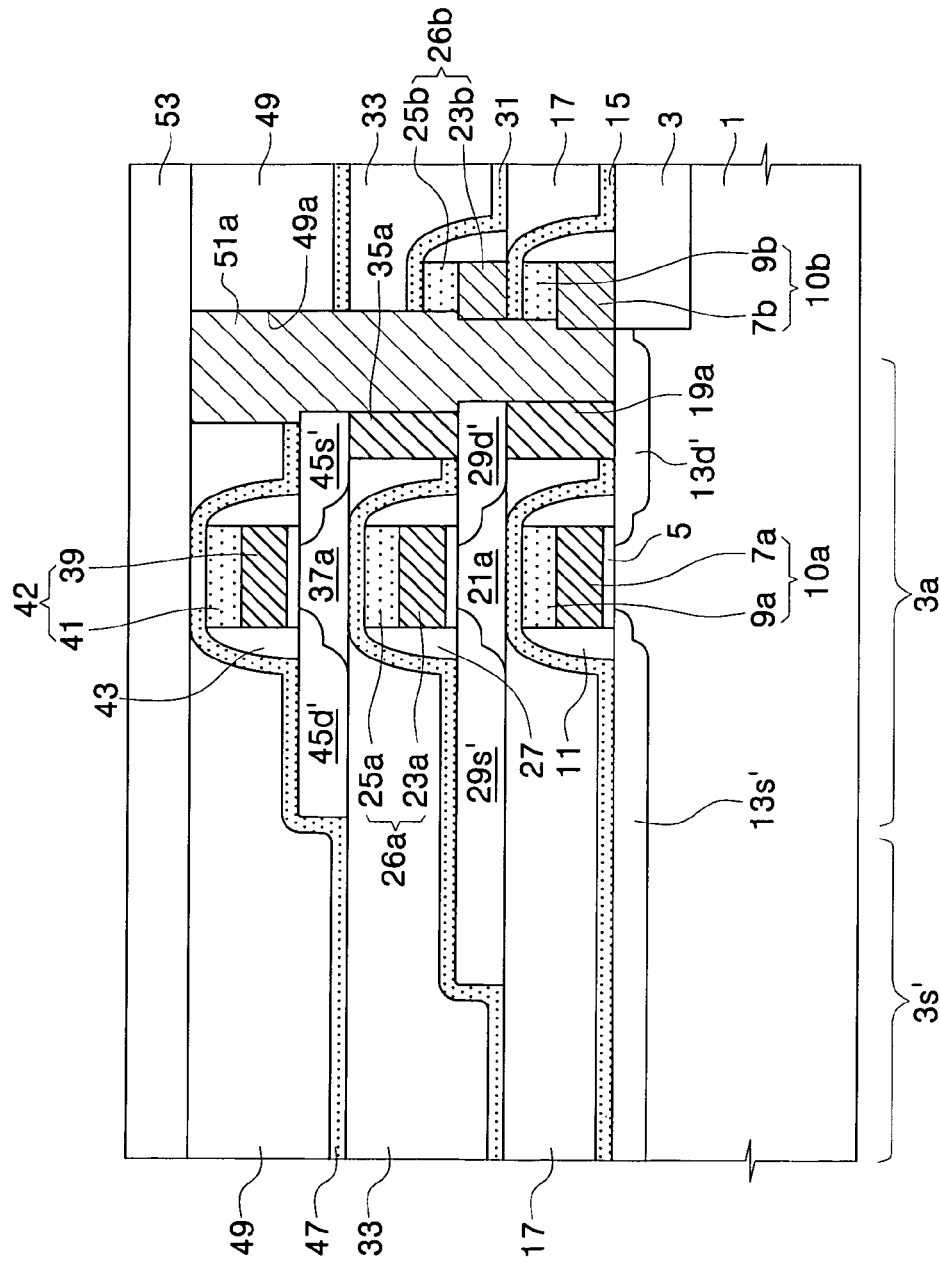
Figure 14B:
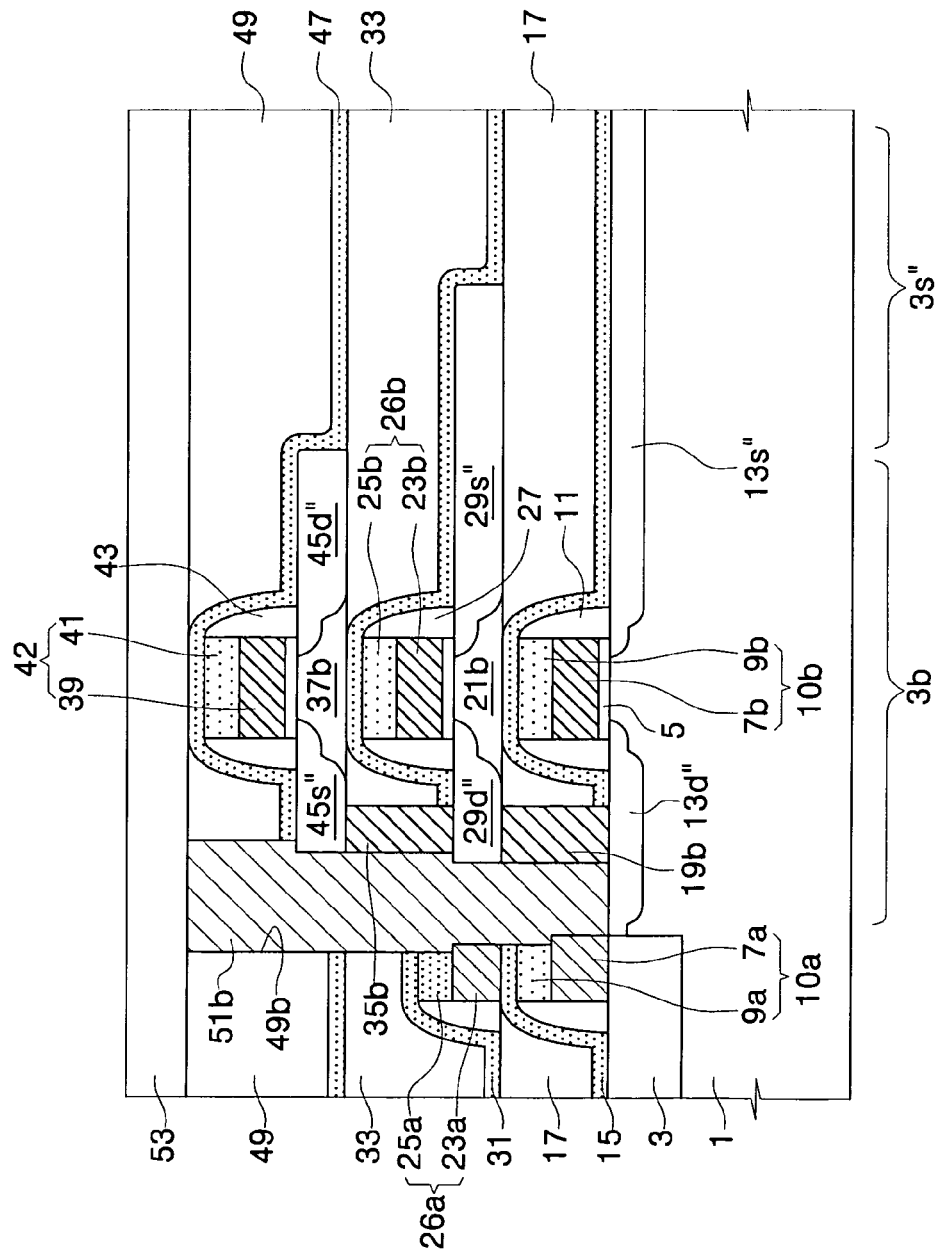
Figure 14C:
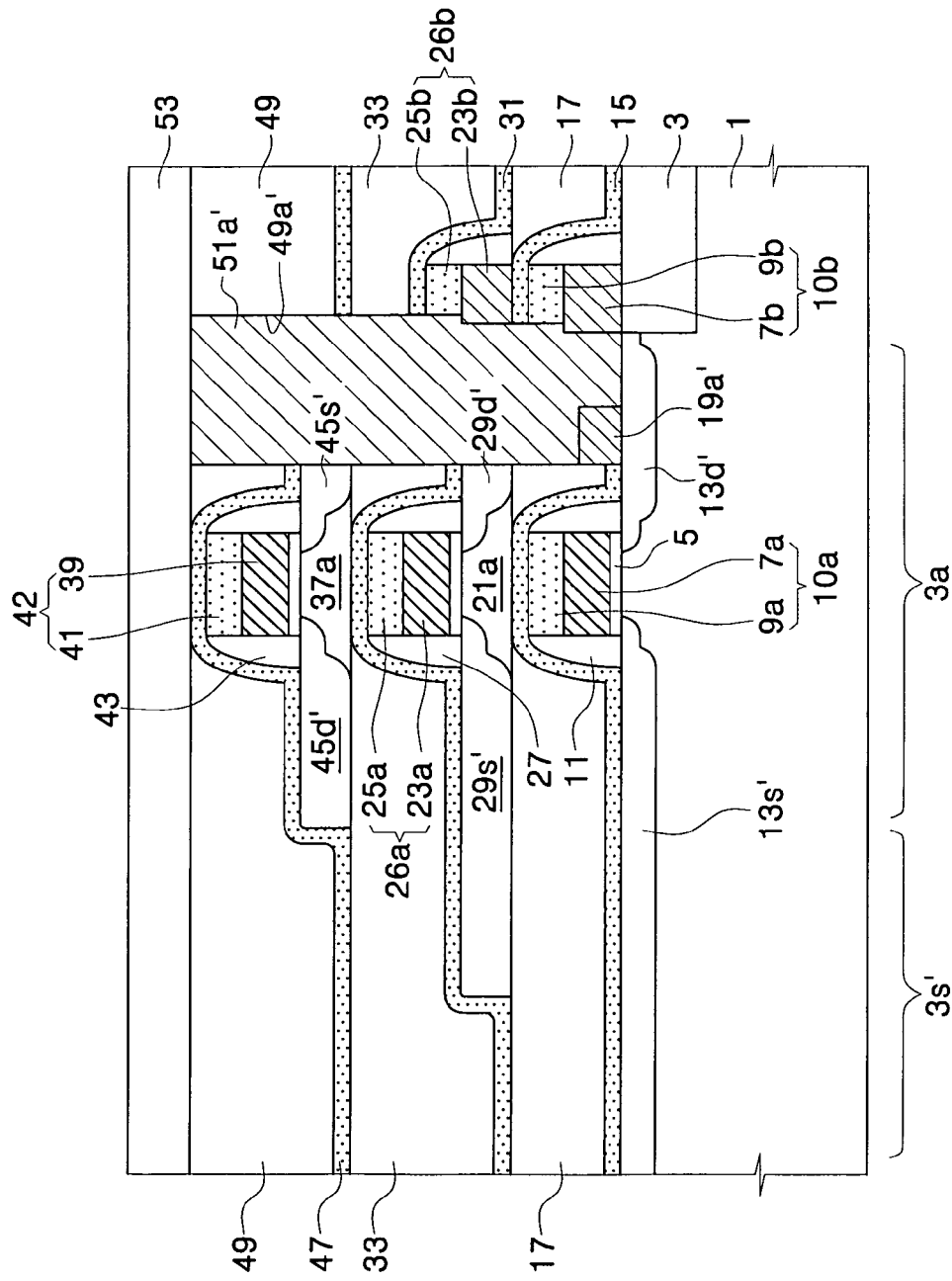
FIG. 14C is a cross-sectional view illustrating a first node contact structure of CMOS SRAM cells in accordance with other embodiments of the present invention.

As shown in FIG. 14C, a first node plug 51a' is provided that penetrates the first source region 45s' of the first transfer transistor TT1, the first upper node semiconductor plug 35a, the first drain region 29d' of the first load transistor TL1, the first lower node semiconductor plug 19a, the first through third interlayer insulating layers 17, 33 and 49, and at least the second and third etch stoppers 31 and 47. In these embodiments, a first recessed lower node semiconductor plug 19a' may be provided between the first node plug 51a' and the first drain region 13d' of the first driver transistor TD1. In these embodiments, the first source region 45s' of the first transfer transistor TT1, the first drain region 29d' of the first load transistor TL1, the second load gate electrode 23b, and the second driver gate electrode 7b are electrically connected to the first node plug 51a', and the first node plug 51a' is electrically connected to the first drain region 13d' of the first driver transistor TD1 through the first recessed lower node semiconductor plug 19a'. The first node plug 51a' may comprise, for example, a conductor having an ohmic contact with respect to all N-type and P-type semiconductor materials. By way of example, the first node plug 51a' may comprise a metal plug such as a tungsten plug or a tungsten plug with and a barrier metal layer surrounding the tungsten plug.

In embodiments of the present invention in which the first recessed lower node semiconductor plug 19a' has a conductivity type that is different than the conductivity type of the first drain region 13d' of the first driver transistor TD1, the first node plug 51a' may extend to contact with a sidewall of the first recessed lower node semiconductor plug 19a' and a surface of the first drain region 13d' (as is shown in FIG. 14C).

It will be appreciated that the second node contact structure that is formed on the second drain region 13d'' of the second driver transistor TD2 may have the same shape as the first node contact structure described above with reference to FIG. 14C.

Numerous additional modifications may be made to the SRAM cells according to the above embodiments of the present invention. For example, the first and second lower TFTs may correspond, respectively, to the first and second transfer transistors TT1 and TT2 shown in FIG. 1, and the first and second upper TFTs may correspond, respectively, to the first and second load transistors TL1 and TL2 shown in FIG. 1. In this case, it will be apparent to one skilled in the art in light of the disclosure herein that the word line pattern 42, the power line 59c and the bit lines 65b' and 65b'' would be changed to reflect this revised configuration.

Now, methods of fabricating SRAM cells in accordance with certain embodiments of the present invention will be described with reference to FIGS. 2-9, 10A-17A and 10B-17B. FIGS. 10A-17A are cross-sectional views taken along the line I-I of FIGS. 2-9 respectively, and FIGS. 10B-17B are cross-sectional views taken along the line II-II of FIGS. 2-9 respectively. As discussed above, FIG. 14C is a cross-sectional view that illustrates methods of forming node contact structures in accordance with further embodiments of the present invention.

Figure 10A:
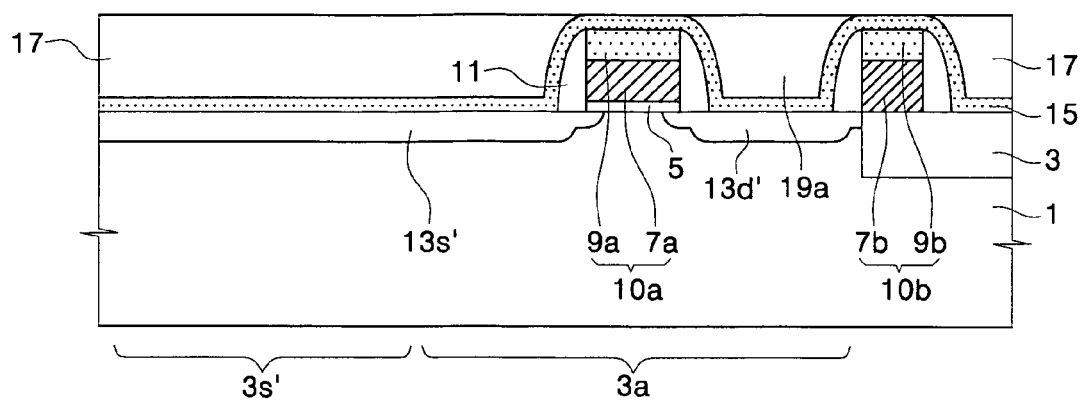
Figure 10B:
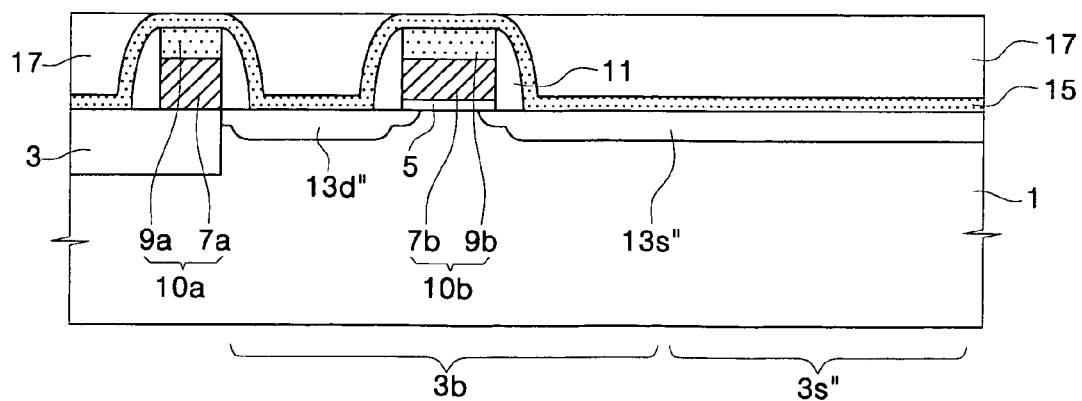

As shown in FIGS. 2, 10A and 10B, an isolation layer 3 is formed at a predetermined region of a semiconductor substrate 1 such as a single crystalline silicon substrate to define first and second parallel active regions 3a and 3b. The semiconductor substrate 1 may, for example, comprise a P-type silicon substrate. The first and second active regions 3a and 3b may be formed to be in parallel with a y-axis. In addition, the isolation layer 3 may be formed to provide a first ground active region 3s' that extends from one end of the first active region 3a along the x-axis and a second ground active region 3s''' that extends from one end of the second active region 3b along the x-axis. The first and second ground active regions 3s' and 3s''' may be formed to face to each other.

A gate insulating layer 5 is formed on the active regions 3a, 3b, 3s' and 3s'''. A gate conductive layer and a gate capping insulating layer are sequentially formed on the semiconductor substrate having the gate insulating layer 5. The gate capping insulating layer may be formed, for example, of silicon oxide or silicon nitride. The gate capping insulating layer and the gate conductive layer may then be patterned to form the first driver gate pattern 10a crossing over the first active region 3a and to form the second driver gate pattern 10b crossing over the second active region 3b. As a result, the first driver gate pattern 10a is formed to have a first driver gate electrode 7a and a first capping insulating layer pattern 9a which are sequentially stacked, and the second driver gate pattern 10b is formed to have a second driver gate electrode 7b and a second capping insulating layer pattern 9b which are sequentially stacked. The gate capping insulating layer may be omitted in certain embodiments of the present invention. The first and second driver gate patterns 10a and 10b may be formed to be adjacent to the second and first active regions 3b and 3a, respectively.

Impurity ions may be implanted into the active regions 3a, 3b, 3s' and 3s'' using, for example, the driver gate patterns 10a and 10b as ion implantation masks to form a spaced apart first source region 13s' and first drain region 13d' in the first active region 3a and to form a spaced apart second source region 13s'' and second drain region 13d'' in the second active region 3b. The first and second drain regions 13d' and 13d'' and the first and second source regions 13s' and 13s'' may be N-type impurity regions. The first source region 13s' and the first drain region 13d' may be formed at respective sides of a channel region that is below the first driver gate pattern 10a. Similarly, the second source region 13s'' and the second drain region 13d'' may be formed at respective sides of a channel region that is below the second driver gate pattern 10b. As shown best in FIG. 10A, the first source region 13s' may also be formed in the first ground active region 3s', and as shown best in FIG. 10B, the second source region 13s'' may also be formed in the second ground active region 3s''. When, for example, the first and second drain regions 13d' and 13d'' and the first and second source regions 13s' and 13s'' are formed to have an LDD structure, driver gate spacers 11 may be formed on sidewalls of the first and second driver gate patterns 10a and 10b. The driver gate spacers 11 may be formed, for example, of a silicon nitride layer or a silicon oxide layer.

The first driver gate pattern 10a, the first source region 13s' and the first drain region 13d' may constitute a first bulk transistor such as, for example, the first N-channel driver transistor TD1 of FIG. 1. Likewise, the second driver gate pattern 10b, the second source region 13s'' and the second drain region 13d'' may constitute a second bulk transistor such as, for example, the second N-channel driver transistor TD2 of FIG. 1.

A first interlayer insulating layer 17 may be formed on the semiconductor substrate having the first and second bulk transistors (e.g., driver transistors TD1 and TD2 of FIG. 1). A first etch stopper 15 may also be formed prior to formation of the first interlayer insulating layer 17. The first etch stopper 15 may, for example, be formed of an insulating layer having an etch selectivity with respect to the first interlayer insulating layer 17. For example, when the first interlayer insulating layer 17 is formed of a silicon oxide layer, the first etch stopper 15 may be formed of a silicon oxynitride layer or a silicon nitride layer. The first interlayer insulating layer 17 may be planarized using, for example, a chemical mechanical polishing technique. When such a chemical mechanical polishing technique is used, the first etch stopper 15 on the driver gate patterns 10a and 10b may act as the stop layer. Using this or other techniques, the first interlayer insulating layer 17 may be formed to have a relatively uniform thickness.

Figure 11A:
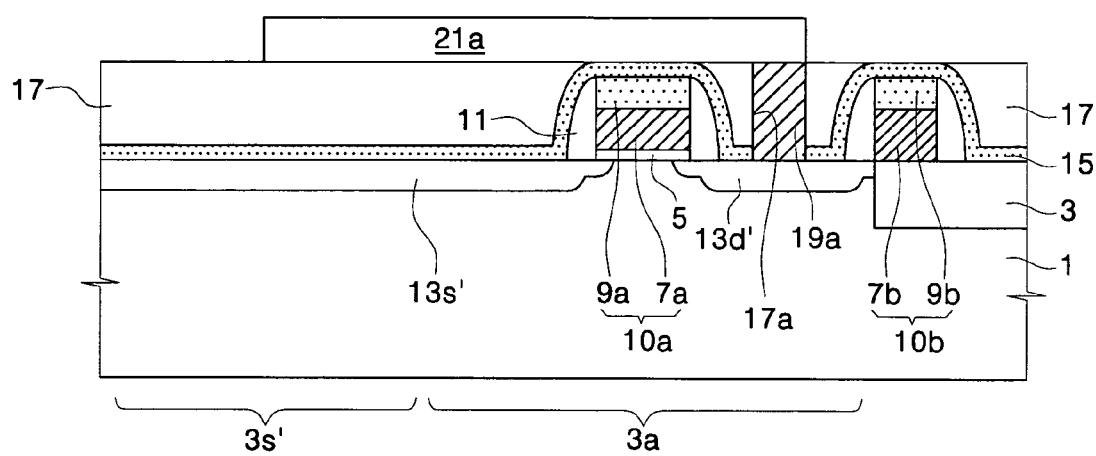
Figure 11B:
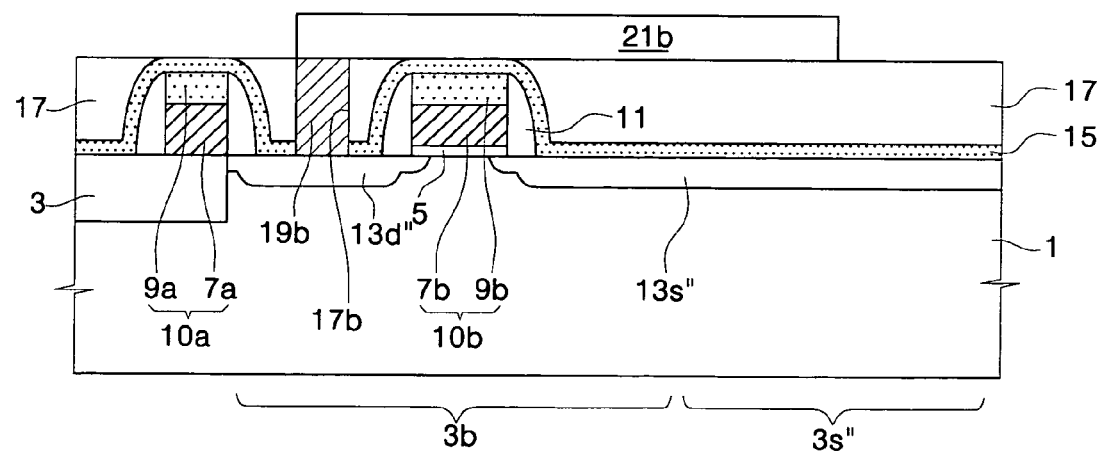

Referring to FIGS. 3, 11A and 11B, the first interlayer insulating layer 17 and the first etch stopper 15 may be patterned to form first and second lower node contact holes 17a and 17b that expose the first and second drain regions 13d' and 13d'' respectively. First and second lower node semiconductor plugs 19a and 19b may be formed in the first and second lower node contact holes 17a and 17b, respectively, using, for example, a selective epitaxial growth technique. When the semiconductor substrate 1 is a single crystalline silicon substrate, the first and second lower node semiconductor plugs 19a and 19b may be formed to have a single crystalline silicon structure.

A lower body layer may then be formed on the top surface of the semiconductor substrate having the first and second lower node semiconductor plugs 19a and 19b. By way of example, if the lower node semiconductor plugs 19a and 19b are single crystalline silicon plugs, the lower body layer may be formed as an amorphous silicon layer or a polycrystalline silicon layer. As shown best in FIGS. 1A and 11B, the lower body layer may then be patterned to form first and second lower body patterns 21a and 21b. The first lower body pattern 21a may overlap the first active region 3a and may cover the first and second lower node semiconductor plugs 19a. The second lower body pattern 21b may overlap the second active region 3b and may cover the second lower node semiconductor plug 19b. The first lower body pattern 21a may include an extension that overlaps a portion of the first ground active region 3s' and the second lower body pattern 21b may include an extension that overlaps a portion of the second ground active region 3s''.

The first and second lower body patterns 21a and 21b may be crystallized using, for example, a solid phase epitaxial (SPE) technique that is well known in the art. For example, the SPE technique may include annealing at a temperature of about 500° C. to 800° C. to crystallize the lower body patterns 21a and 21b.

When an SPE process is used to crystallize the lower body patterns 21a and 21b, the lower node semiconductor plugs 19a and 19b may act as seed layers during the SPE process. As a result, if the lower node semiconductor plugs 19a and 19b are single crystalline silicon plugs, then the lower body patterns 21a and 21b may be converted to have a single crystalline structure through the SPE process.

Crystallization of the lower body patterns 21a and 21b may be carried out either before or after the lower body layer is patterned. However, if the crystallization of the lower body patterns 21a and 21b is carried out prior to patterning the lower body layer, a grain boundary may be formed in a region of the lower body layer (i.e., a region positioned at the same distance from the first and second lower node semiconductor plugs). Such a grain boundary, if formed, may be located in a channel region of load transistors that are formed in a subsequent process. If this occurs, the electrical characteristics of the load transistors may be degraded and/or the load transistors that are formed may exhibit non-uniform electrical characteristics.

Figure 12A:
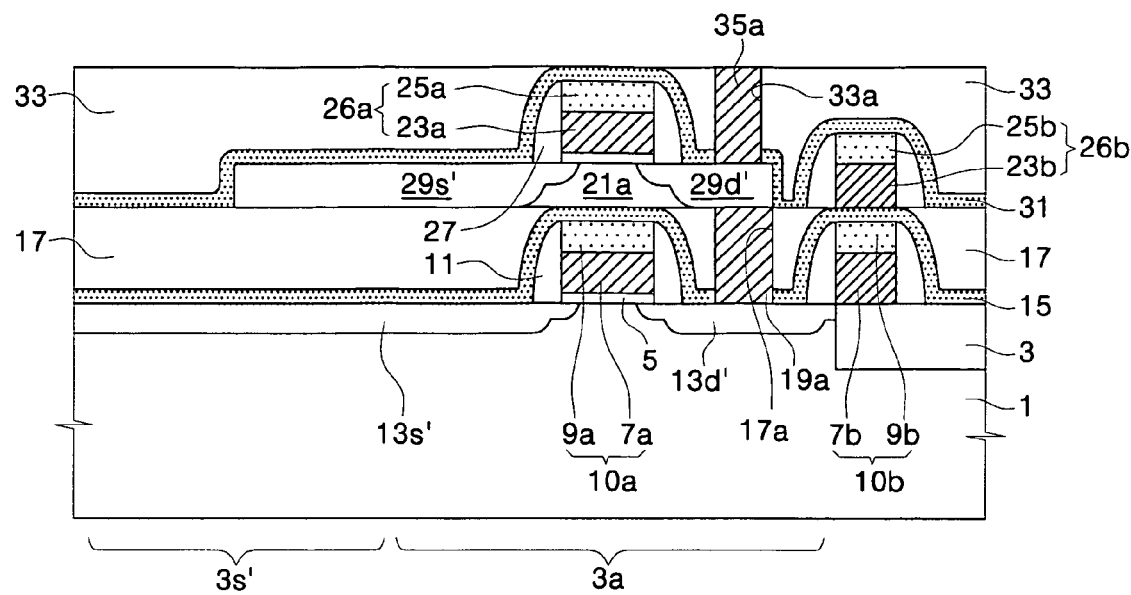
Figure 12B:
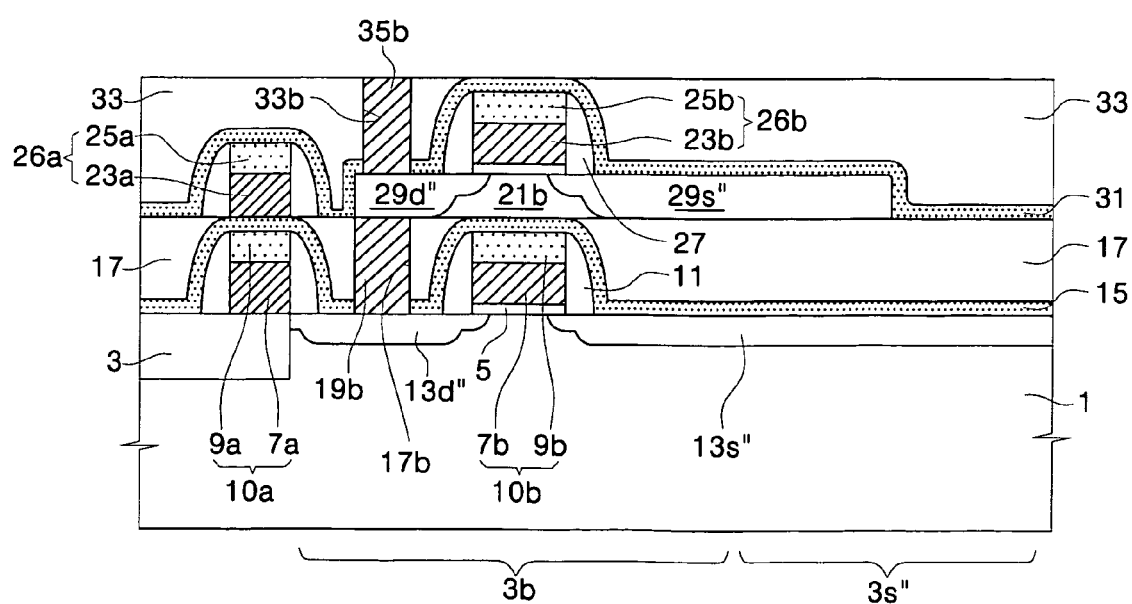

Referring to FIGS. 4, 12A and 12B, a gate insulating layer may be formed on surfaces of the first and second lower body patterns 21a and 21b. First and second insulated load gate patterns 26a and 26b may then be formed that cross over the first and second lower body patterns 21a and 21b, respectively. As shown in FIGS. 12A and 12B, the first and second insulated load gate patterns 26a and 26b may also be formed to overlap the first and second driver gate patterns 10a and 10b, respectively. The first and second insulated load gate patterns 26a and 26b may be fabricated using the same method (described above) which is used to form the first and second driver gate patterns 10a and 10b. Accordingly, the first load gate pattern 26a may comprise a first load gate electrode 23a and a first capping insulating layer pattern 25a which are sequentially stacked, and the second load gate pattern 26b may comprise a second load gate electrode 23b and a second capping insulating layer pattern 25b which are sequentially stacked.

Impurity ions may also be implanted into the lower body patterns 21a and 21b using, for example, the load gate patterns 26a and 26b as ion implantation masks. As a result, a first source region 29s' and a first drain region 29d' are formed in spaced apart portions of the first lower body region 21a, and a second source region 29s''' and a second drain region 29d''' are formed in spaced apart portions of the second lower body region 21b. The first source region 29s' and the first drain region 29d' may be formed on opposite sides of a channel region below the first load gate pattern 26a, and the second source region 29s''' and the second drain region 29d''' may be formed on opposite sides of a channel region below the second load gate pattern 26b. The first and second source regions 29s' and 29s''' may also be formed in the respective extensions of the first lower body pattern 21a and the second lower body pattern 21b. The first drain region 29d' is formed in the first lower body pattern 21a on the first lower node semiconductor plug 19a, and the second drain region 29d''' is formed in the second lower body pattern 21b on the second lower node semiconductor plug 19b. The first and second drain regions 29d' and 29d''' and the first and second source regions 29s' and 29s''' may all be P-type impurity regions.

When, for example, the first and second drain regions 29d' and 29d''' and the first and second source regions 29s' and 29s''' are formed to have an LDD structure, load gate spacers 27 may be formed on sidewalls of the first and second load gate patterns 26a and 26b. The load gate spacers 27 may be formed, for example, of a silicon nitride layer or a silicon oxide layer.

The first load gate pattern 26a, the first source region 29s' and the first drain region 29d' together constitute a first lower TFT such as, for example, the first P-channel load transistor TL1 of FIG. 1. Similarly, the second load gate pattern 26b, the second source region 29s''' and the second drain region 29d''' together constitute a second lower TFT such as, for example, the second P-channel load transistor TL2 of FIG. 1.

A second interlayer insulating layer 33 may be formed on a top surface of the semiconductor substrate having the first and second load transistors TL1 and TL2. A second etch stopper 31 may optionally be formed prior to formation of the second interlayer insulating layer 33. The second etch stopper 31 and the second interlayer insulating layer 33 may be fabricated using the same methods as the methods (described above) used to form the first etch stopper 15 and the first interlayer insulating layer 17.

The second interlayer insulating layer 33 and the second etch stopper 31 may be patterned to form first and second upper node contact holes 33a and 33b that expose the first and second drain regions 29d' and 29d''', respectively. First and second upper node semiconductor plugs 35a and 35b may then be formed in the first and second upper node contact holes 33a and 33b, respectively, using, for example, a selective epitaxial growth process. When the first and second lower body patterns 21a and 21b are single crystalline silicon patterns, the first and second upper node semiconductor plugs 35a and 35b may be formed to have a single crystalline silicon structure.

Figure 13A:
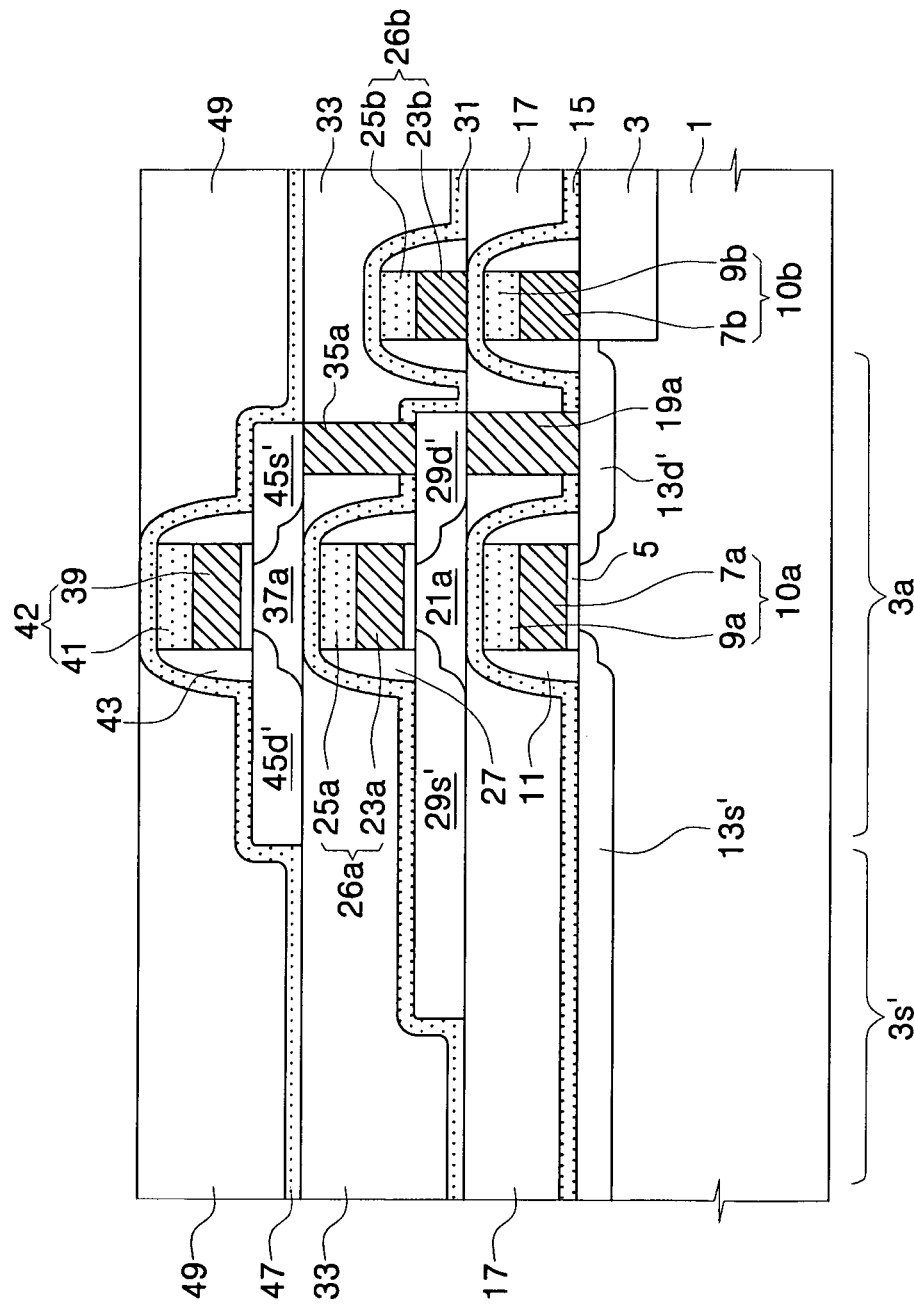
Figure 13B:
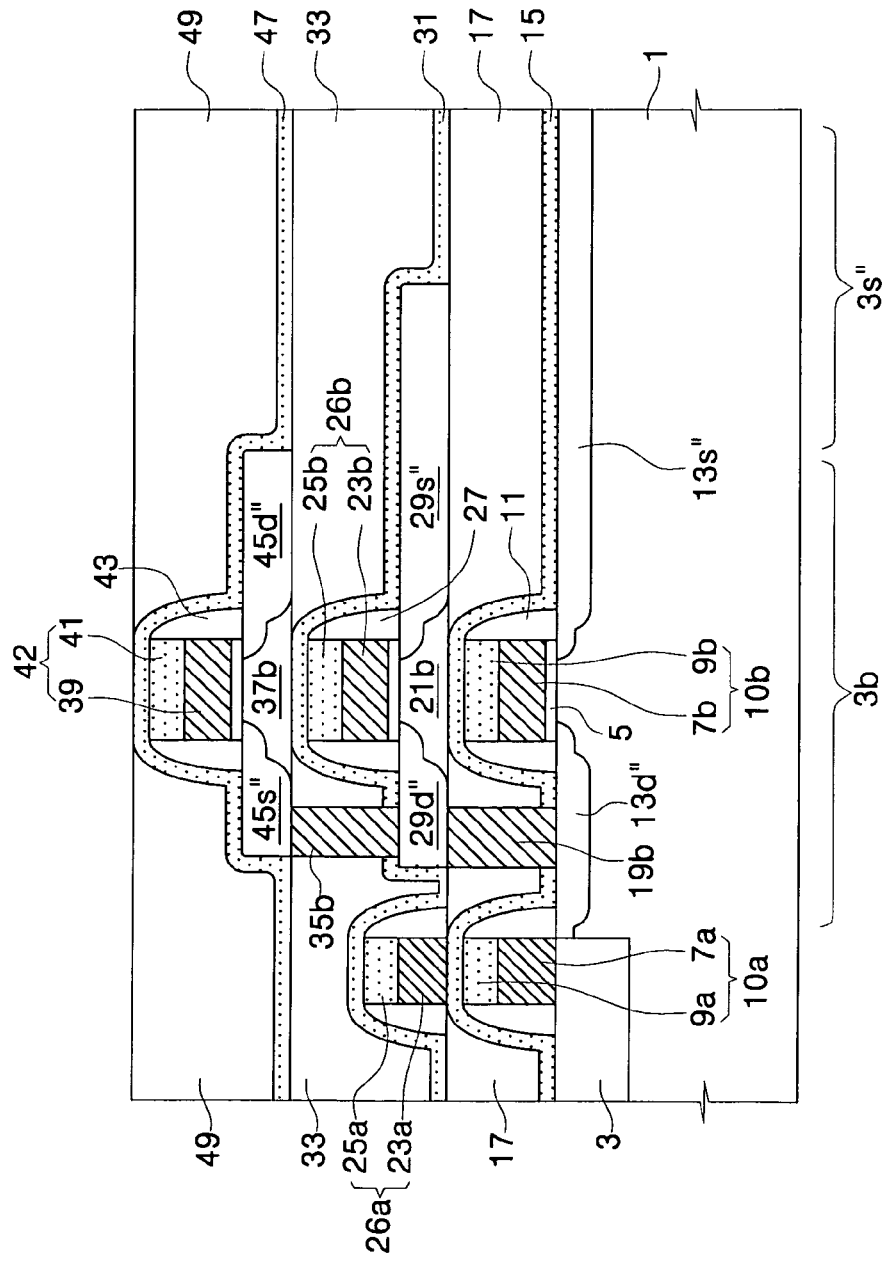

Referring to FIGS. 5, 13A and 13B, first and second upper body patterns 37a and 37b may be formed on the semiconductor substrate having the first and second upper node semiconductor plugs 35a and 35b. The first and second upper body patterns 37a and 37b may be formed using, for example, the same methods as the methods (described above) used to form the first and second lower body patterns 21a and 21b. Thus, the first and second upper body patterns 37a and 37b may be formed to be in contact with the first and second upper node semiconductor plugs 35a and 35b respectively, and may be crystallized using an SPE technique. In addition, the first and second upper body patterns 37a and 37b may be formed to overlap the first and second lower body patterns 21a and 21b, respectively. However, as shown in FIGS. 13A and 13B, the first and second upper body patterns 37a and 37b may be formed such that they do not overlap extensions of the first and second lower body patterns 21a and 21b.

An insulated transfer gate pattern 42 may be formed to cross over the first and second upper body patterns 37a and 37b. The insulated transfer gate pattern 42 may comprise a word line pattern 42. The word line pattern 42 may comprise a word line 39 and a capping insulating layer pattern 41 which are sequentially stacked. Impurity ions may be implanted into the upper body patterns 37a and 37b using the word line pattern 42, for example, as an ion implantation mask. As a result, a first source region 45s' and a first drain region 45d are formed in spaced apart portions of the first upper body pattern 37a, and a second source region 45s''' and a second drain region 45d''' are formed in spaced apart portions of the second upper body pattern 37b. The first source region 45s' and the first drain region 45d' may be self-aligned with the word line pattern 42. The second source region 45s''' and the second drain region 45d''' may also be self-aligned with the word line pattern 42. When, for example, the first and second drain regions 45d' and 45d''' and the first and second source regions 45s' and 45s''' have an LDD type structure, a word line spacer 43 may be formed on a sidewall of the word line pattern 42. The first and second drain regions 45d' and 45d''' and the first and second source regions 45s' and 45s''' may be N-type impurity regions.

The first source region 45s' may be formed in the first upper body pattern 37a on the first upper node semiconductor plug 35a, and the second source region 45s''' may be formed in the second upper body pattern 37b on the second upper node semiconductor plug 35b. The word line pattern 42, the first source region 45s' and the first drain region 45d' together constitute a first upper TFT such as, for example, the first N-channel transfer transistor TT1 of FIG. 1. Likewise, the word line pattern 42, the second source region 45s''' and the second drain region 45d''' together constitute a second upper TFT such as, for example, the second N-channel transfer transistor TT2 of FIG. 1.

A third interlayer insulating layer 49 may be formed on a top surface of the semiconductor substrate having the first and second transfer transistors TT1 and TT2. A third etch stopper 47 may be formed prior to formation of the third interlayer insulating layer 49. The third etch stopper 47 and the third interlayer insulating layer 49 may be formed, for example, using the same methods as the methods (described above) used to form the first etch stopper 15 and the first interlayer insulating layer 17.

Referring to FIGS. 6, 14A and 14B, the first to third etch stoppers 15, 31, and 47 and the first to third interlayer insulating layers 17, 33 and 49 may be patterned to form a first node contact hole 49a and a second node contact hole 49b. The first node contact hole 49a may be formed to expose the first source region 45s' of the first transfer transistor TT1, the first upper node semiconductor plug 35a, the first drain region 29d' of the first load transistor TL1, the first lower node semiconductor plug 19a, the second load gate electrode 23b and the second driver gate electrode 7b. The second node contact hole 49b may be formed to expose the second source region 45s''' of the second transfer transistor TT2, the second upper node semiconductor plug 35b, the second drain region 29d'' of the second load transistor TL2, the second lower node semiconductor plug 19b, the first load gate electrode 23a and the first driver gate electrode 7a. When, for example, the first and second lower node semiconductor plugs 19a and 19b have a different conductivity type from the first and second drain regions 13d' and 13d'' or are formed of a intrinsic semiconductor, the first and second node contact holes 49a and 49b may also be formed to expose the first and second drain regions 13d' and 13d'' respectively.

A conductive layer is formed on the semiconductor substrate having the first and second node contact holes 49a and 49b. The conductive layer may then be planarized to expose the third interlayer insulating layer 49. As a result, first and second node plugs 51a and 51b are formed in the first and second node contact holes 49a and 49b, respectively. The first and second node plugs 51a and 51b may be formed of a conductive layer that forms an ohmic contact with respect to P-type and N-type semiconductor materials. For example, the conductive layer may be formed of a metal layer such as a tungsten layer or may be formed by sequentially stacking a barrier metal layer such as a titanium nitride layer and a metal layer such as a tungsten layer. In this case, each of the first and second node plugs 51a and 51b may be formed to have a tungsten plug and a barrier metal layer pattern surrounding the tungsten plug.

As a result, a first inverter composed of the first driver transistor TD1 and the first load transistor TL1 is cross-coupled with a second inverter composed of the second driver transistor TD2 and the second load transistor TL2 by the node plugs 51a and 51b.

A fourth interlayer insulating layer 53 may be formed on a top surface of the semiconductor substrate having the node plugs 51a and 51b.

Alternatively, the first and second node plugs 51a and 51b may be formed to have another configuration which is different from the first and second node plugs 51a and 51b.

FIG. 14C is a cross-sectional diagram that illustrates methods of forming first node plugs of SRAM cells in accordance with further embodiments of the present invention.

Referring to FIG. 14C, the first to third interlayer insulating layers 17, 33 and 49, the first to third etch stoppers 15, 31 and 47, the first and second source regions 45s' and 45s''' of the transfer transistors TT1 and TT2, the first and second drain regions 29d' and 29d'' of the load transistors TL1 and TL2, the first and second upper node semiconductor plugs 35a and 35b, and the first and second lower node semiconductor plugs 19a and 19b may be etched to form a first node contact hole 49a' and a second node contact hole (not shown). In this case, the first and second lower node semiconductor plugs 19a and 19b may be recessed so that a first recessed lower node semiconductor plug 19a' and a second recessed lower node semiconductor plug (not shown) remain on the first and second drain regions 13d' and 13d'' respectively.

When, for example, the first and second lower node semiconductor plugs 19a and 19b have a different conductivity type from the first and second drain regions 13d' and 13d'' or are formed of an intrinsic semiconductor, the first and second node contact holes may be formed to expose the first drain region 13d' adjacent to the first recessed lower node semiconductor plug 19a' and the second drain region 13d'' adjacent to the second recessed lower node semiconductor plug, respectively.

A first node plug 51a' and a second node plug (not shown) are formed in the first and second node contact holes, respectively. The first node plug 51a' and the second node plug may be formed using the same method as described with reference to FIGS. 14A and 14B.

Figure 15A:
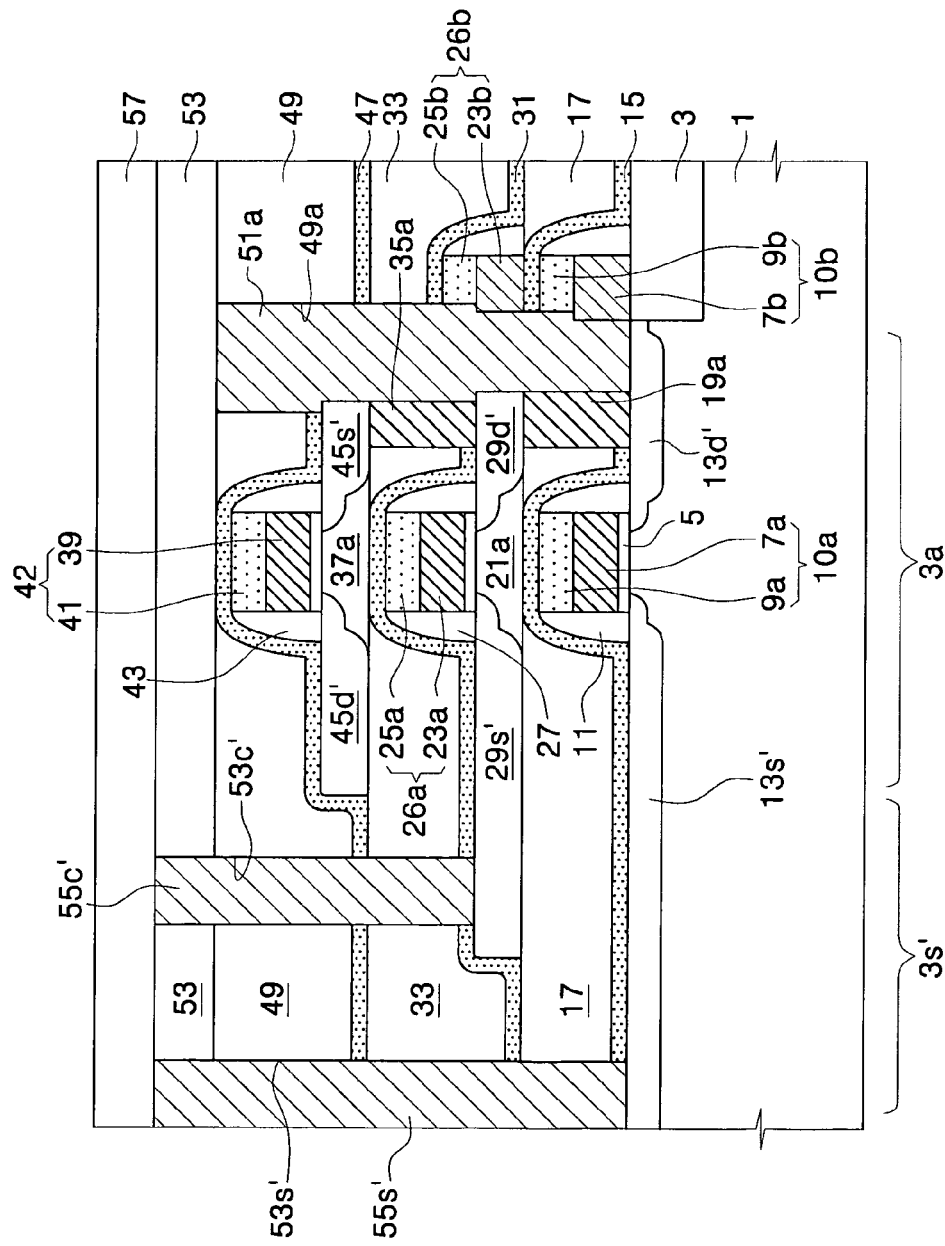
Figure 15B:
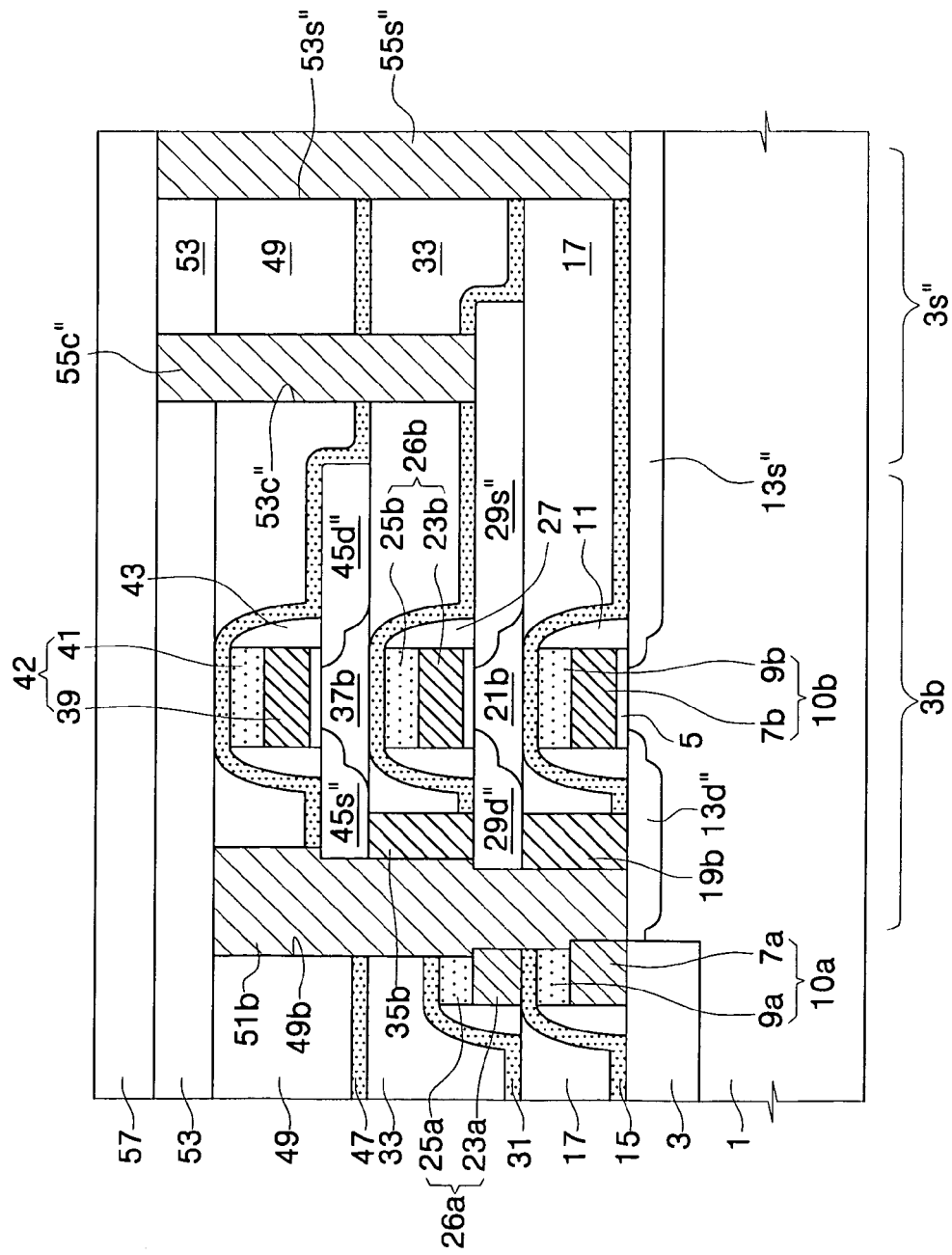

Referring to FIGS. 7, 15A and 15B, the first to third etch stoppers 15, 31 and 47 and the first to fourth interlayer insulating layers 17, 33, 49 and 53 may be patterned to form first and second ground line contact holes 53s' and 53s'''. The first ground line contact hole 53s' may be formed to expose the first source region 13s' in the first ground active region 3s', and the second ground line contact hole 53s''' may be formed to expose the second source region 13s''' in the second ground active region 3s'''. During formation of first and second ground line contact holes 53s' and 53s''', first and second power line contact holes 53c' and 53c'' may be formed to expose the extension of the first lower body pattern 21a (i.e., the source region 29s' of the first load transistor) and the extension of the second lower body pattern 21b (i.e., the source region 29s''' of the second load transistor), respectively.

First and second ground line contact plugs 55s' and 55s''' are formed in the first and second ground line contact holes 53s' and 53s''' respectively. During formation of the ground line contact plugs 55s' and 55s''', first and second power line contact plugs 55c' and 55c'' may be formed in the first and second power line contact holes 53c' and 53c'' respectively. The ground line contact plugs 55s' and 55s''' and the first and second power line contact plugs 55c' and 55c'' may be formed, for example, of a conductive layer that forms an ohmic contact with both P-type and N-type semiconductor materials. For example, the ground line contact plugs 55s' and 55s''' and the first and second power line contact plugs 55c' and 55c'' may be formed using the same methods as the methods described above with reference to FIGS. 14A and 14B for forming the node plugs 51a and 51b.

A fifth interlayer insulating layer 57 may hten be formed on a top surface of the semiconductor substrate having the ground line contact plugs 55s' and 55s''' and the power line contact plugs 55c' and 55c''.

Figure 16A:
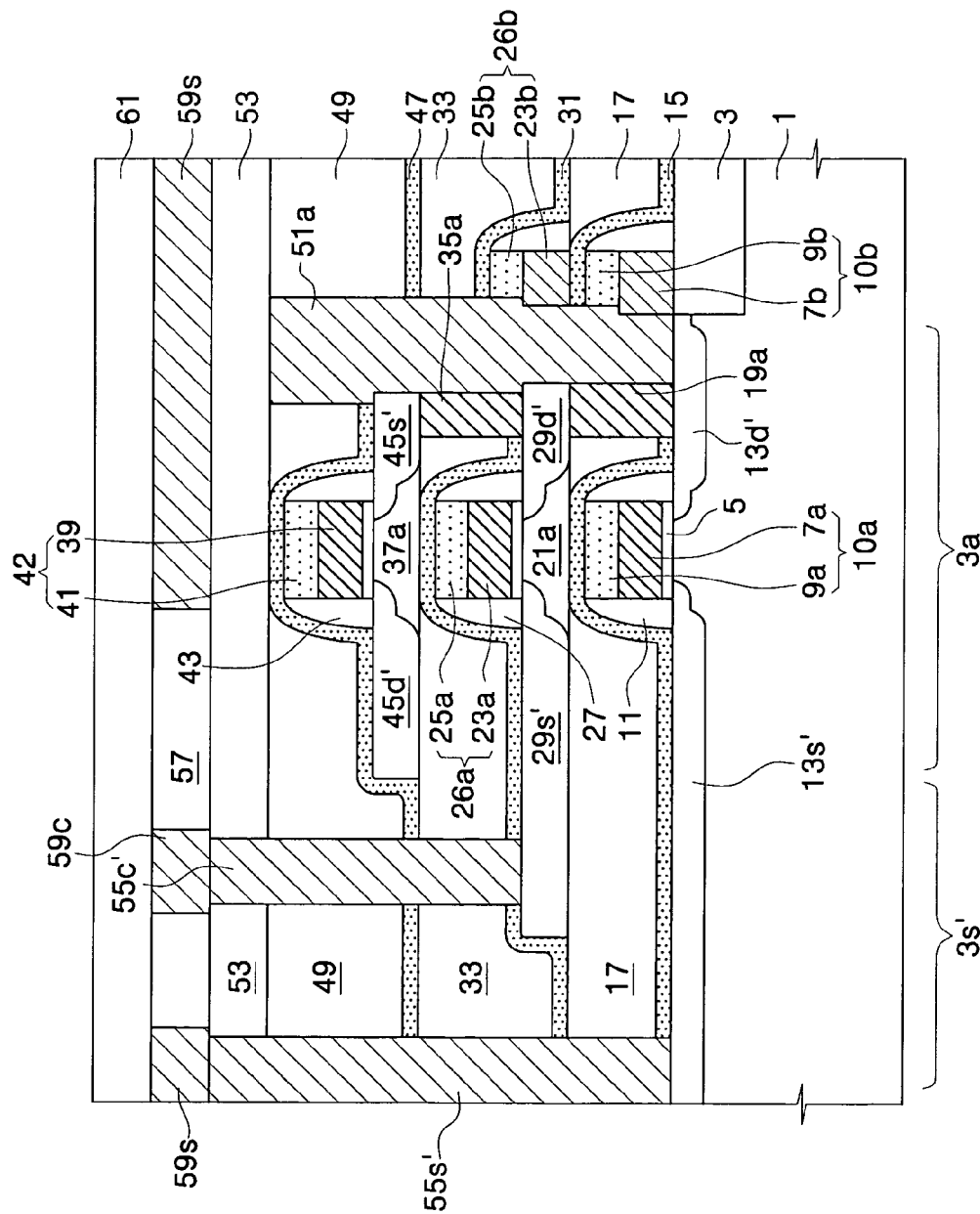
Figure 16B:
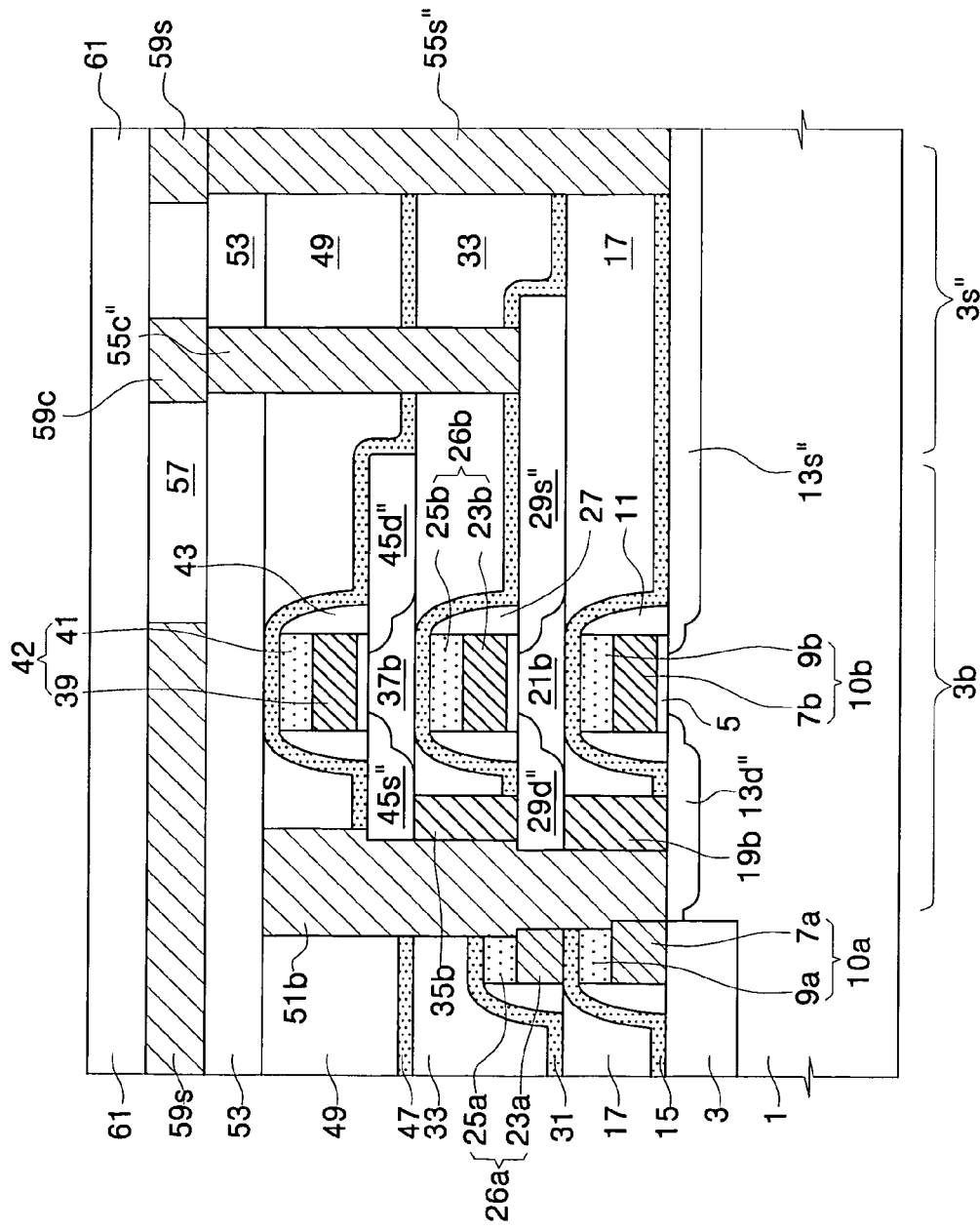

As shown in FIGS. 8, 16A and 16B, ground lines 59s and power lines 59c may be formed in the fifth interlayer insulating layer 57 using, for example, a damascene technique. The ground lines 59s and the power lines 59c may be formed to be substantially parallel to the word line pattern 42. The ground lines 59s may be formed over the unit cells arranged in odd rows (parallel with the x-axis), and the power lines 59c may be formed over unit cells arranged in even rows. In further embodiments of the present invention, the ground lines 59s may be formed over unit cells arranged in even rows and the power lines 59c may be formed over the unit cells arranged in odd rows. The ground lines 59s may cover the first and second ground line contact plugs 55s' and 55s''', and the power lines 59c may cover the first and second power line contact plugs 55c' and 55c''. A sixth interlayer insulating layer 61 may then be formed on a top surface of the semiconductor substrate having the ground lines 59s and the power lines 59c.

Referring to FIGS. 9, 17A and 17B, the third to sixth interlayer insulating layers 49, 53, 57 and 61 and the third etch stopper 47 may be etched to form first and second bit line contact holes 61b' and 61b''. The first bit line contact hole 61b' may expose the first drain region 45d' of the first transfer transistor TT1, and the second bit line contact hole 61b'' may expose the second drain region 45d'' of the second transfer transistor TT2. First and second bit line contact plugs 63b' and 63b'' may be formed in the first and second bit line contact holes 61b' and 61b'' respectively. First and second parallel bit lines 65b' and 65b'' may be formed on the sixth interlayer insulating layer 61. The first and second bit lines 65b' and 65b'' may cross over the ground lines 59s and the power lines 59c. The first bit line 65b' may cover the first bit line contact plug 63b', and the second bit line 65b" may cover the second bit line contact plug 63b".

Herein, reference is made to transistors (or other elements) that are "at" or "formed at" a semiconductor substrate (or other region). These terms are used to indicate that the transistor (or other element) is provided on and/or in the semiconductor substrate (or other region). Thus, for example, in some embodiments of the present invention, portions of the transistor (e.g., a source region, a drain region and/or a channel region) may be provided in the semiconductor substrate while other portions (e.g., a gate) is provided on the semiconductor substrate. In other embodiments, the transistor may be formed in its entirety on the substrate (such as may be the case with a semiconductor-on-insulator transistor). In each instance, the transistor would be "at" or "formed at" the semiconductor substrate.

Herein, reference is also made to a first transistor that "overlaps" a second transistor. A first transistor "overlaps" a second transistor if an axis exists that is perpendicular to the semiconductor substrate on which the transistors are formed that passes through any portion of both transistors (e.g., the gate, source and/or drain). In certain embodiments of the present invention, various of the transistors may have a more complete overlap of one or more additional transistors such that an axis exists that is perpendicular to the semiconductor substrate on which the transistors are formed that passes through the controlled terminal (e.g., the gate) of the first transistor and any portion of the second transistor. Herein, a second transistor that is configured in this matter is said to "overlap the gate" of the first transistor.

Herein, reference is further made to first and/or second "impurity regions" of various transistors. By the term "impurity region" it is meant a region of the transistor that includes intentionally doped or added impurities such as, for example, a semiconductor region that includes implanted impurity ions. The source and drain regions of a transistor, however formed, would each comprise an "impurity region."

Various embodiments of the present invention that are described and claimed herein include "etch stopper" layers. These etch stopper layers may, for example, be provided to facilitate the etching of a first interlayer insulating layer that is provided on the etch stopper layer. It will be appreciated that the etch stopper may be implemented as a second interlayer insulating layer that is provided below the first interlayer insulating layer that is to be etched.

In addition, various embodiments of the present invention include first, second and third interlayer insulating layers. It will be appreciated that each of the first, second or third interlayer insulating layers may comprise a single layer or may comprise multiple layers which together form the first, second or third interlayer insulating layer. By way of example, in the embodiment of the present invention depicted in FIGS. 17A and 17B, layer 15, layer 17 or the combination of layers 15 and 17 may be considered to comprise the first interlayer insulating layer.

Herein reference is also made to "single crystalline" layers. By "single crystalline" it is meant that the material generally has the structure of a single crystal (i.e., has long range in its structure). "Single crystalline" layers are in contrast to polycrystalline layers, which are materials that have the structure of a collection of small crystals (somewhat similar to a honeycomb structure) and amorphous materials, which are materials that have no (long-range) order in its structure whatsoever (or combinations of polycrystalline and amorphous materials). Reference is also made herein to "single crystalline transistors." This phrase refers to transistors having a channel that is formed in a single crystalline semiconductor layer or region.

Reference is also made herein to "bulk" transistors and "thin film" transistors. It will be appreciated by those of skill in the art that "bulk" transistors refer to transistors that include source/drain regions that are formed in a semiconductor substrate, whereas "thin film" transistors refer to transistors that are formed at layers of the device that are above the substrate.

Herein reference is also made to various types of "node plugs." Herein, the term "node plug" refers to a conductive plug that electrically interconnects two or more electrical elements (e.g., transistors, capacitors, etc.) in a device.

As noted above, according to embodiments of the present invention, a pair of lower TFTs and a pair of upper TFTs may be sequentially stacked on a pair of bulk transistors. In certain embodiments of the present invention, the above-mentioned transistors may constitute a latch circuit with a pair of node contact structures to provide, for example, an SRAM cell. The lower TFTs and the upper TFTs may be formed in single crystalline body patterns which can provide excellent electrical characteristics.

In the drawings and specification, there have been disclosed typical embodiments of the invention and, although specific terms are employed, they are used in a generic and descriptive sense only and not for purposes of limitation, the scope of the invention being set forth in the following claims.

What is claimed is:

1. An integrated circuit comprising:
a first transistor having first and second impurity regions formed at a semiconductor substrate;
a first interlayer insulating layer on the first transistor;
a second transistor having first and second impurity regions on the first interlayer insulating layer opposite the first transistor;
a second interlayer insulating layer on the second transistor opposite the first interlayer insulating layer;
a third transistor having first and second impurity regions on the second interlayer insulating layer opposite the second transistor;
a third interlayer insulating layer on the third transistor opposite the second interlayer insulating layer; and
a node plug penetrating the first, second and third interlayer insulating layers to electrically connect the first impurity region of the first transistor, the first impurity region of the second transistor and the first impurity region of third transistor to one another.

2. The integrated circuit as recited in claim 1, wherein the second transistor overlaps the first transistor, and wherein the third transistor overlaps the second transistor.

3. The integrated circuit as recited in claim 1, wherein the first transistor comprises a bulk transistor and wherein the second and third transistors comprise thin film transistors.

4. The integrated circuit as recited in claim 3, wherein the second and third transistors each comprise single crystalline thin film transistors.

5. The integrated circuit as recited in claim 1, wherein the node plug forms an ohmic contact with respect to both P-type semiconductor and N-type semiconductor materials.

6. The integrated circuit as recited in claim 5, wherein the metal plug comprises a tungsten plug.

7. The integrated circuit as recited in claim 6, wherein the metal plug further comprises a barrier metal layer surrounding the tungsten plug.

8. The integrated circuit as recited in claim 1, wherein the lower node semiconductor plug and the first impurity region of the first transistor are of the same conductivity type.

9. An integrated circuit comprising:
a first transistor having first and second impurity regions formed at a semiconductor substrate;
a first interlayer insulating layer on the first transistor;
a second transistor having first and second impurity regions on the first interlayer insulating layer opposite the first transistor;
a second interlayer insulating layer on the second transistor opposite the first interlayer insulating layer;
a third transistor having first and second impurity regions on the second interlayer insulating layer opposite the second transistor;
a third interlayer insulating layer on the third transistor opposite the second interlayer insulating layer;
a node plug penetrating the first, second and third interlayer insulating layers to
electrically connect the first impurity region of the first transistor, the first impurity region of the second transistor and the first impurity region of third transistor to one another;
a lower node semiconductor plug between the first impurity region of the second transistor and the first impurity region of the first transistor; and
an upper node semiconductor plug between the first impurity region of the third transistor and the first impurity region of the second transistor,
wherein the node plug also is electrically connected to the lower and upper node semiconductor plugs, and
wherein the lower node semiconductor plug and the first impurity region of the first transistor have different conductivity types, and wherein the node plug is in direct contact with the first impurity region of the first transistor.

10. A static random access memory (SRAM) cell comprising:
a first bulk transistor having a first impurity region formed at least partially in a semiconductor substrate;
a second bulk transistor having a first impurity region formed at least partially in the semiconductor substrate;
a first interlayer insulating layer on the first and second bulk transistors;
a first lower thin film transistor having a first impurity region on the first interlayer insulating layer;
a second lower thin film transistor having a first impurity region on the first interlayer insulating layer;
a second interlayer insulating layer on the first and second lower thin film transistors;
a first upper thin film transistor having a first impurity region on the second interlayer insulating layer;
a second upper thin film transistor having a first impurity region on the second interlayer insulating layer;
a third interlayer insulating layer on the first and second upper thin film transistors;
a first node plug penetrating the first, second and third interlayer insulating layers to electrically connect the first impurity region of the first bulk transistor, the first impurity region of the first lower thin film transistor and the first impurity region of the first upper thin film transistor to one another;
a second node plug penetrating the first, second and third interlayer insulating layers to electrically connect the first impurity region of the second bulk transistor, the first impurity region of the second lower thin film transistor and the first impurity region of the second upper thin film transistor to one another;
a first lower node semiconductor plug between the first impurity region of the first lower thin film transistor and the first impurity region of the first bulk transistor;
a first upper node semiconductor plug between the first impurity region of the first upper thin film transistor and the first impurity region of the first lower thin film transistor;
a second lower node semiconductor plug between the first impurity region of the second lower thin film transistor and the first impurity region of the second bulk transistor; and
a second upper node semiconductor plug between the first impurity region of the second upper thin film transistor and the first impurity region of the second lower thin film transistor,
wherein the first node plug is electrically connected to the first lower node semiconductor plug and the first upper node semiconductor plug, and wherein the second node plug is electrically connected to the second lower node semiconductor plug and the second upper node semiconductor plug,
wherein the first and second upper node semiconductor plugs and the first and second lower node semiconductor plugs each comprise single crystalline semiconductor plugs, and wherein the first and second node plugs each comprise metal plugs.

11. The SRAM cell as recited in claim 10, wherein the first lower thin film transistor overlaps the first bulk transistor and wherein the second lower thin film transistor overlaps the second bulk transistor, and wherein the first upper thin film transistor overlaps the first lower thin film transistor, and wherein the second upper thin film transistor overlaps the second lower thin film transistor.

12. The SRAM cell as recited in claim 10, wherein the first and second lower thin film transistors and the first and second upper thin film transistors each comprise single crystalline thin film transistors.

13. The SRAM cell as recited in claim 10, wherein the first and second node plugs each form an ohmic contact with respect to both P-type semiconductor and N-type semiconductor materials.

14. The SRAM cell as recited in claim 10, wherein the first and second node plugs each comprise a tungsten plug.

15. The SRAM cell as recited in claim 14, wherein each of the first and second node plugs further comprises a barrier metal layer surrounding the tungsten plug.

16. The SRAM cell as recited in claim 10, wherein the first lower node semiconductor plug has the same conductivity type as the first impurity region of the first bulk transistor and the second lower node semiconductor plug has the same conductivity type as the first impurity region of the second bulk transistor.

17. The SRAM cell as recited in claim 10, wherein the first lower node semiconductor plug has a different conductivity type than does the first impurity region of the first bulk transistor, and wherein the second lower node semiconductor plug has a different conductivity type than does the first impurity region of the second bulk transistor, and wherein the first node plug is in direct contact with the first impurity region of the first bulk transistor, and wherein the second node plug is in direct contact with the first impurity region of the second bulk transistor.

18. The SRAM cell as recited in claim 10, wherein the first and second bulk transistors comprise first and second N-channel driver transistors, respectively, and wherein the first impurity region of the first bulk transistor comprises the drain region of the first bulk transistor, and wherein the first impurity region of the second bulk transistor comprises the drain region of the second bulk transistor.

19. The SRAM cell as recited in claim 18, wherein the first N-channel driver transistor has a gate electrode that is electrically connected to the second node plug, and wherein the second N-channel driver transistor has a gate electrode that is electrically connected to the first node plug.

20. The SRAM cell as recited in claim 19, wherein the first and second lower thin film transistors comprise first and second P-channel load transistors, respectively, and wherein the first and second upper thin film transistors comprise first and second N- channel transfer transistors, respectively, and wherein the first impurity region of the first lower thin film transistor comprises a drain region of the first lower thin film transistor, and wherein the first impurity region of the second lower thin film transistor comprises a drain region of the second lower thin film transistor, and wherein the first impurity region of the first upper thin film transistor comprises a source region of the first upper thin film transistor and wherein the first impurity region of the second upper thin film transistor comprises a source region of the second upper thin film transistor.

21. The SRAM cell as recited in claim 20, wherein the first P-channel load transistor has a gate electrode that is electrically connected to the second node plug, and the second P-channel load transistor has a gate electrode that is electrically connected to the first node plug.

22. The SRAM cell as recited in claim 20, wherein the first and second N-channel transfer transistors have gate electrodes that are electrically connected to each other to act as a word line.

23. The SRAM cell as recited in claim 20, further comprising:
  a ground line that is electrically connected to the source regions of the first and second N-channel driver transistors; and
  a power line that is electrically connected to the source regions of the first and second P-channel load transistors;
  wherein the ground line and the power line are substantially in parallel with a gate electrode of the first N-channel driver transistor and with a gate electrode of the second N- channel driver transistor.

24. The SRAM cell as recited in claim 21, further comprising:
  a first bit line that is electrically connected to the drain region of the first N-channel transfer transistor; and
  a second bit line that is electrically connected to the drain region of the second N- channel transfer transistor;
  wherein the first and second bit lines cross over the power line and the ground line.

25. The SRAM cell as recited in claim 24, wherein the first bit line is substantially perpendicular to a gate electrode of the first N-channel driver transistor, a gate electrode of the first P-channel load transistor and a gate electrode of the first N-channel transfer transistor when viewed from an axis that is perpendicular to the primary plane of the semiconductor substrate, and the second bit line is substantially perpendicular to a gate electrode of the second N-channel driver transistor, a gate electrode of the second P-channel load transistor and a gate electrode of the second N-channel transfer transistor when viewed from an axis that is perpendicular to the primary plane of the semiconductor substrate.

26. The SRAM cell as recited in claim 19, wherein the first and second lower thin film transistors comprise first and second N-channel transfer transistors, respectively, and wherein the first and second upper thin film transistors comprise first and second P-channel load transistors, respectively, and wherein the first impurity region of the first lower thin film transistor comprises a source region of the first lower thin film transistor, and wherein the first impurity region of the second lower thin film transistor comprises a source region of the second lower thin film transistor, and wherein the first impurity region of the first upper thin film transistor comprises a drain region of the first upper thin film transistor and wherein the first impurity region of the second upper thin film transistor comprises a drain region of the second upper thin film transistor.

27. The SRAM cell as recited in claim 26, wherein the first P-channel load transistor has a gate electrode that is electrically connected to the second node plug, and wherein the second P-channel load transistor has a gate electrode that is electrically connected to the first node plug.

28. A static random access memory (SRAM) cell comprising:
  an isolation layer in a semiconductor substrate that defines first and second active regions;
  a first bulk transistor and a second bulk transistor at least partially in the first and second active regions, respectively;
  a first interlayer insulating layer on the first and second bulk transistors;
  a first single crystalline lower body pattern and a second single crystalline lower body pattern on the first interlayer insulating layer;
  a first lower thin film transistor and a second lower thin film transistor at the first and second lower body patterns, respectively;
  a second interlayer insulating layer on the first and second lower thin film transistors;
  a first single crystalline upper body pattern and a second single crystalline upper body pattern on the second interlayer insulating layer;
  a first upper thin film transistor and a second upper thin film transistor at the first and second upper body patterns, respectively;
  a third interlayer insulating layer on the first and second upper thin film transistors;
  a first node plug penetrating the first, second and third interlayer insulating layers to electrically connect a first impurity region of the first bulk transistor, a first impurity region of the first lower thin film transistor and a first impurity region of the first upper thin film transistor to one another;
  a second node plug penetrating the first, second and third interlayer insulating layers to electrically connect a first impurity region of the second bulk transistor, a first impurity region of the second lower thin film transistor and a first impurity region of the second upper thin film transistor to one another;
  a first ground active region extending from a first end of the first active region in a direction perpendicular to the first active region;
  a second ground active region extending from a first end of the second active region in a direction perpendicular to the second active region and
  a ground line that is electrically connected to the first and second around active regions,
  wherein the ground line crosses over the first and second active regions,
  wherein the first and second bulk transistors comprise first and second N-channel driver transistors, respectively, wherein the first impurity region of the first bulk transistor comprises the drain region of the first bulk transistor, and wherein the first impurity region of the second bulk transistor comprises the drain region of the second bulk transistor.

29. The SRAM cell as recited in claim 28, wherein the first N-channel driver transistor has a gate electrode that is electrically connected to the second node plug, and wherein the second N-channel driver transistor has a gate electrode that is electrically connected to the first node plug.

30. The SRAM cell as recited in claim 28, wherein the first and second lower thin film transistors are first and second P-channel load transistors, respectively, and wherein the first and second upper thin film transistors are first and second N-channel transfer transistors, respectively, and wherein the first impurity region of the first lower thin film transistor comprises a drain region of the first lower thin film transistor, and wherein the second lower thin film transistor comprises a drain region of the second lower thin film transistor, and wherein the first impurity region of the first upper thin film transistor comprises a source region of the first upper thin film transistor, and wherein the first impurity region of the second upper thin film transistor comprises a source region of the second upper thin film transistor.

31. The SRAM cell as recited in claim 30, wherein the first lower body pattern overlaps the first active region, and wherein the second lower body pattern overlaps the second active region, and wherein the first upper body pattern overlaps the first lower body pattern, and wherein the second upper body pattern overlaps the second lower body pattern.

32. The SRAM cell as recited in claim 31, wherein a gate electrode of the first load transistor overlaps a gate electrode of the first driver transistor, and wherein a gate electrode of the second load transistor overlaps the gate electrode of the second driver transistor, and wherein the gate electrode of the first load transistor is electrically connected to the second node plug, and wherein the gate electrode of the second load transistor is electrically connected to the first node plug.

33. The SRAM cell as recited in claim 30, wherein a gate electrode of the first transfer transistor is electrically connected to a gate electrode of the second transfer transistor to act as a word line.

34. A static random access memory (SRAM) cell comprising:
    an isolation layer in a semiconductor substrate that defines first and second active regions;
    a first bulk transistor and a second bulk transistor at least partially in the first and second active regions, respectively;
    a first interlayer insulating layer on the first and second bulk transistors;
    a first single crystalline lower body pattern and a second single crystalline lower body pattern on the first interlayer insulating layer;
    a first lower thin film transistor and a second lower thin film transistor at the first and second lower body patterns, respectively;
    a second interlayer insulating layer on the first and second lower thin film transistors;
    a first single crystalline upper body pattern and a second single crystalline upper body pattern on the second interlayer insulating layer;
    a first upper thin film transistor and a second upper thin film transistor at the first and second upper body patterns, respectively;
    a third interlayer insulating layer on the first and second upper thin film transistors;
    a first node plug penetrating the first, second and third interlayer insulating layers to electrically connect a first impurity region of the first bulk transistor, a first impurity region of the first lower thin film transistor and a first impurity region of the first upper thin film transistor to one another;
    a second node plug penetrating the first, second and third interlayer insulating layers to electrically connect a first impurity region of the second bulk transistor, a first impurity region of the second lower thin film transistor and a first impurity region of the second upper thin film transistor to one another;
    a first ground active region extending from a first end of the first active region in a direction perpendicular to the first active region,
    a second ground active region extending from a first end of the second active region in a direction perpendicular to the second active region,
    wherein the first and second bulk transistors comprise first and second N-channel driver transistors, respectively,
    wherein the first impurity region of the first bulk transistor comprises the drain region of the first bulk transistor, and
    wherein the first impurity region of the second bulk transistor comprises the drain region of the second bulk transistor, and
    wherein the first and second lower thin film transistors are first and second P-channel load transistors, respectively, and wherein the first and second upper thin film transistors are first and second N-channel transfer transistors, respectively, and wherein the first impurity region of the first lower thin film transistor comprises a drain region of the first lower thin film transistor, and wherein the second lower thin film transistor comprises a drain region of the second lower thin film transistor, and wherein the first impurity region of the first upper thin film transistor comprises a source region of the first upper thin film transistor, and wherein the first impurity region of the second upper thin film transistor comprises a source region of the second upper thin film transistor,
    wherein the first lower body pattern overlaps the first active region, and wherein the second lower body pattern overlaps the second active region. and wherein the first upper body pattern overlaps the first lower body pattern, and wherein the second upper body pattern overlaps the second lower body pattern.
    wherein the first lower body pattern further includes an extension that overlaps a portion of the first ground active region, and wherein the second lower body pattern further includes an extension that overlaps a portion of the second ground active region.

35. The SRAM cell as recited in claim 34, further comprising:
    a power line that is electrically connected to the extensions of the first and second lower body patterns, wherein the power line crosses over the first and second active regions.

36. A static random access memory (SRAM) cell comprising:
    an isolation layer in a semiconductor substrate that defines first and second active regions;
    a first bulk transistor and a second bulk transistor at least partially in the first and second active regions, respectively;
    a first interlayer insulating layer on the first and second bulk transistors;

a first single crystalline lower body pattern and a second single crystalline lower body pattern on the first interlayer insulating layer;

a first lower thin film transistor and a second lower thin film transistor at the first and second lower body patterns, respectively;

a second interlayer insulating layer on the first and second lower thin film transistors;

a first single crystalline upper body pattern and a second single crystalline upper body pattern on the second interlayer insulating layer;

a first upper thin film transistor and a second upper thin film transistor at the first and second upper body patterns, respectively;

a third interlayer insulating layer on the first and second upper thin film transistors;

a first node plug penetrating the first, second and third interlayer insulating layers to electrically connect a first impurity region of the first bulk transistor, a first impurity region of the first lower thin film transistor and a first impurity region of the first upper thin film transistor to one another;

a second node plug penetrating the first, second and third interlayer insulating layers to electrically connect a first impurity region of the second bulk transistor, a first impurity region of the second lower thin film transistor and a first impurity region of the second upper thin film transistor to one another;

a first ground active region extending from a first end of the first active region in a direction perpendicular to the first active region;

a second ground active region extending from a first end of the second active region in a direction perpendicular to the second active region, a first bit line and a second bit line that is parallel to the first bit line, wherein the first and second bulk transistors comprise first and second N-channel driver transistors, respectively, wherein the first impurity region of the first bulk transistor comprises the drain region of the first bulk transistor, and wherein the first impurity region of the second bulk transistor comprises the drain region of the second bulk transistor, and wherein the first and second lower thin film transistors are first and second P-channel load transistors, respectively, and wherein the first and second upper thin film transistors are first and second N-channel transfer transistors, respectively, and wherein the first impurity region of the first lower thin film transistor comprises a drain region of the first lower thin film transistor, and wherein the second lower thin film transistor comprises a drain region of the second lower thin film transistor, and wherein the first impurity region of the first upper thin film transistor comprises a source region of the first upper thin film transistor, and wherein the first impurity region of the second upper thin film transistor comprises a source region of the second upper thin film transistor, wherein the first bit line is electrically connected to a drain region of the first transfer transistor;

wherein the second bit line is electrically connected to a drain region of the second transfer transistor; and wherein the first and second bit lines cross over the first and second ground active regions.

37. The SRAM cell as recited in claim 36, wherein the first bit line is substantially perpendicular to a gate electrode of the first N-channel driver transistor, a gate electrode of the first P-channel load transistor and a gate electrode of the first N-channel transfer transistor when viewed from an axis that is perpendicular to the primary plane of the semiconductor substrate, and wherein the second bit line is substantially perpendicular to a gate electrode of the second N-channel driver transistor, a gate electrode of the second P- channel load transistor and a gate electrode of the second N-channel transfer transistor when viewed from an axis that is perpendicular to the primary plane of the semiconductor substrate.

* * * * *